(12) United States Patent
Tamura

(10) Patent No.: US 7,482,248 B2
(45) Date of Patent: Jan. 27, 2009

(54) MANUFACTURING METHOD OF SEMICONDUCTOR DEVICE

(75) Inventor: Tomoko Tamura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 273 days.

(21) Appl. No.: 11/274,917

(22) Filed: Nov. 16, 2005

(65) Prior Publication Data

US 2006/0121694 A1    Jun. 8, 2006

(30) Foreign Application Priority Data

Dec. 3, 2004    (JP)    ............................. 2004-351263

(51) Int. Cl.
*H01L 21/30*    (2006.01)
(52) U.S. Cl. .................. 438/458; 438/149; 438/464
(58) Field of Classification Search ................ 438/149, 438/455, 458, 460, 464
See application file for complete search history.

(56) References Cited

U.S. PATENT DOCUMENTS

| | | | |
|---|---|---|---|
| 5,328,868 A * | 7/1994 | Conti et al. ................. | 438/618 |
| 5,665,607 A | 9/1997 | Kawama et al. | |
| 5,757,456 A | 5/1998 | Yamazaki et al. | |
| 6,118,502 A | 9/2000 | Yamazaki et al. | |
| 6,127,199 A | 10/2000 | Inoue et al. | |
| 6,372,608 B1 | 4/2002 | Shimoda et al. | |
| 6,645,830 B2 | 11/2003 | Shimoda | |
| RE38,466 E | 3/2004 | Inoue | |
| 6,818,530 B2 | 11/2004 | Shimoda | |
| 2001/0015256 A1 | 8/2001 | Yamazaki et al. | |
| 2001/0053559 A1 | 12/2001 | Nagao et al. | |
| 2003/0022403 A1 | 1/2003 | Shimoda et al. | |
| 2003/0032210 A1 | 2/2003 | Takayama et al. | |

(Continued)

FOREIGN PATENT DOCUMENTS

EP    0 858 110    8/1998

(Continued)

OTHER PUBLICATIONS

International Search Report dated Mar. 15, 2005 for PCT/JP2004/018978.

(Continued)

*Primary Examiner*—Kevin M Picardat
(74) *Attorney, Agent, or Firm*—Eric J. Robinson; Robinson Intellectual Property Law Office, P.C.

(57) ABSTRACT

A manufacturing method of a semiconductor device at low cost with high reliability, wherein a semiconductor device is manufactured by peeling an element forming layer having a thin film transistor and the like provided over a substrate from the substrate. A metal film is formed on a substrate, plasma treatment is applied thereto to form a metal oxide film on the metal film, an element forming layer is formed on the metal oxide film, an insulating film is formed to cover the element forming layer, an opening is formed in the insulating film and the element forming layer, an etchant is injected through the opening to remove the insulating film and the element forming layer, and the element forming layer is peeled off the substrate. The peeling may be performed by removing the metal film and the metal oxide film partially and then employing a physical means.

52 Claims, 15 Drawing Sheets

U.S. PATENT DOCUMENTS

| | | | |
|---|---|---|---|
| 2003/0071953 A1 | 4/2003 | Yamazaki | |
| 2004/0087110 A1 | 5/2004 | Takayama et al. | |
| 2004/0219762 A1 | 11/2004 | Shimoda | |
| 2004/0256618 A1 | 12/2004 | Imai et al. | |
| 2005/0070038 A1 | 3/2005 | Yamazaki | |
| 2005/0148121 A1 | 7/2005 | Yamazaki et al. | |
| 2005/0285231 A1* | 12/2005 | Arao et al. | 438/689 |

FOREIGN PATENT DOCUMENTS

| | | |
|---|---|---|
| EP | 1 193 759 | 4/2002 |
| EP | 1 351 308 | 10/2003 |
| JP | 08-254686 | 10/1996 |
| JP | 10-125929 | 5/1998 |
| JP | 2001-260580 | 9/2001 |
| JP | 2001-272923 | 10/2001 |
| JP | 2003-203898 | 7/2003 |
| WO | WO 03/010825 | 2/2003 |
| WO | WO 2005/057658 | 6/2005 |

OTHER PUBLICATIONS

Written Opinion dated Mar. 15, 2005 for PCT/JP2004/018978.
International Search Report dated Mar. 22, 2005 for PCT/JP2005/001541.
Written Opinion dated Mar. 22, 2005 for PCT/JP2005/001541.
*"Sense of Crisis" is a trigger, Ignited Evolution of a Sesame-Grain Sized Chip*, Leading Trends, Nikkei Electronics, Nov. 18, 2002, p. 67-76.
Office Action (Application No. 200510128951.8) dated Aug. 29, 2008.

* cited by examiner

17

18

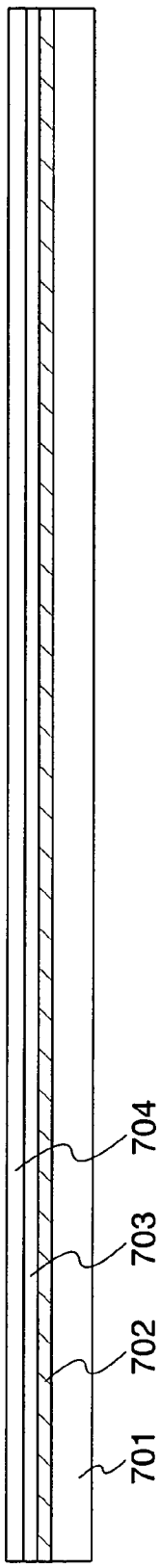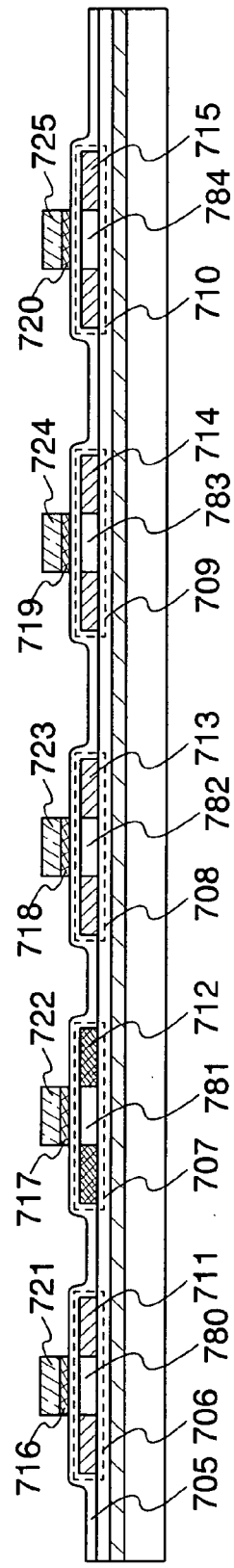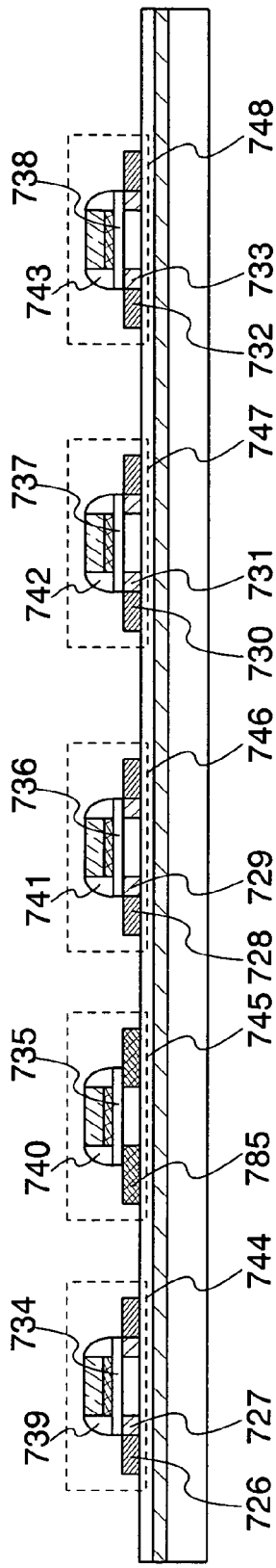

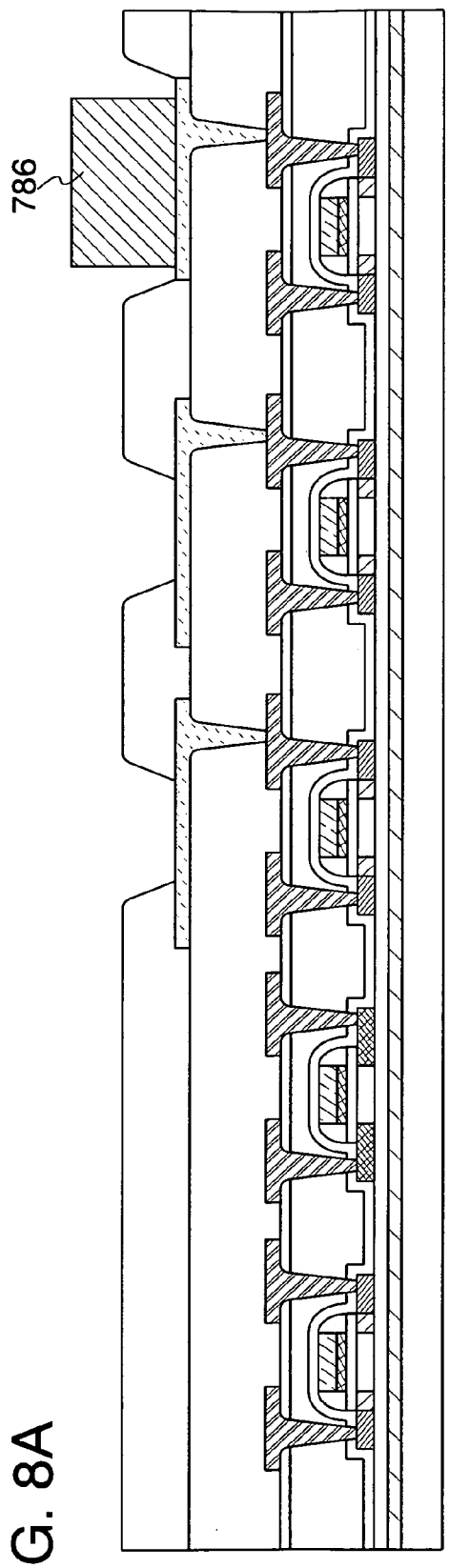
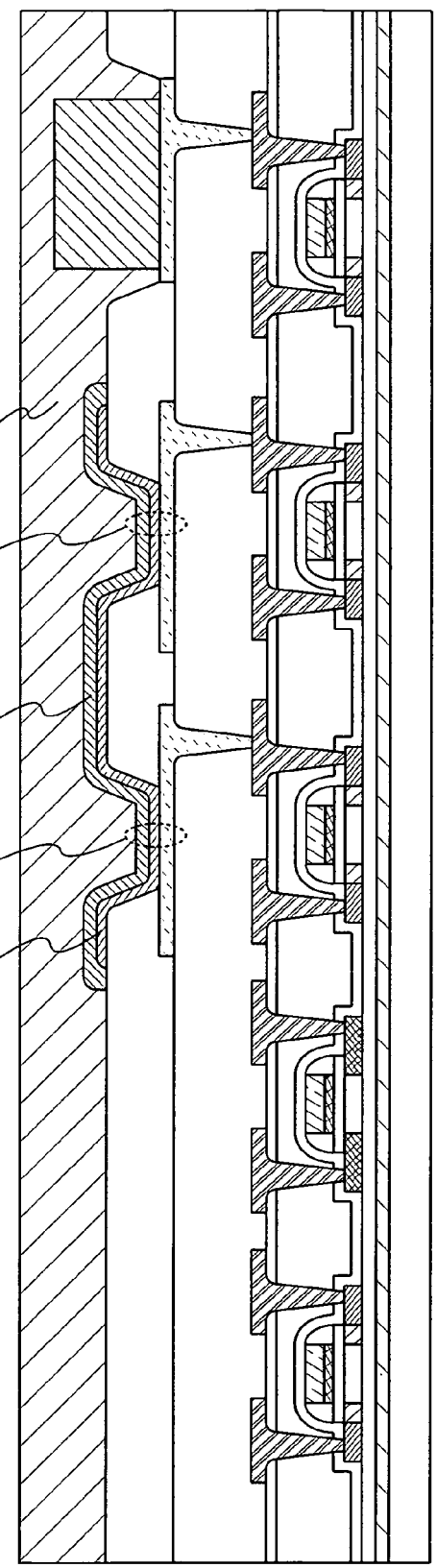
FIG. 8A
FIG. 8B

MANUFACTURING METHOD OF SEMICONDUCTOR DEVICE

BACKGROUND OF THE INVENTION

1. Field of the Invention

The present invention relates to a manufacturing method of a semiconductor device, and particularly to a method for manufacturing a semiconductor device in which an element forming layer is peeled off a supporting substrate by using a peeling layer provided between the supporting substrate and the element forming layer.

2. Description of the Related Art

In recent years, the necessity of a card mounting an RFID (Radio Frequency Identification) or a tag mounting an RFID which can transmit and receive data without contact has been increased in any fields which need automatic recognition such as management of valuable securities and merchandise. The card mounting an RFID reads and writes data from/to an external device via a loop antenna in the card without contact. The card mounting an RFID has larger memory capacity and higher security than a magnetic card that records data by a magnetic recording method. Hence, a mode of the card mounting an RFID capable of being applied to various fields has been proposed recently.

In general, an RFID is constituted by an antenna and an IC chip which is formed by an element forming layer including a transistor and the like provided over a silicon wafer. In recent years, however, technological development of an RFID using an element forming layer provided over a glass substrate or the like has been advanced for cost reduction. According to such a technology, the element forming layer provided over the glass substrate is required to be separated from the glass substrate which is a supporting substrate after being completely manufactured. Various techniques have been contrived as a method for separating the element forming layer provided over the supporting substrate.

For example, there are a method of taking out an element forming layer by making a supporting substrate thin by grinding or polishing, a method of removing a supporting substrate by chemical reaction and the like, a method of peeling a supporting substrate and an element forming layer, and the like. As a method of peeling an element forming layer provided over a supporting substrate, there is a known technique that a separating layer formed of amorphous silicon (or polysilicon) is provided, and hydrogen contained in the amorphous silicon is released by laser light irradiation through a substrate, thereby a space is generated to separate the supporting substrate (see Patent Document 1). In addition, there is a technique that a peeling layer containing silicon is provided between an element forming layer and a supporting substrate, and the peeling layer is removed by using gas containing halogen fluoride to separate the element forming layer from the supporting substrate (see Patent Document 2). As described above, there are many methods for separating an element forming layer provided over a supporting substrate.

[Patent Document 1] Japanese Patent Laid-Open No. Hei 10-125929

[Patent Document 2] Japanese Patent Laid-Open No. Hei 8-254686

However, the methods of removing a supporting substrate by grinding, polishing, or dissolving cause problems such as a damage due to physical strength such as stress, and contamination. Furthermore, according to such methods, it is quite difficult to reuse a substrate and the cost is increased.

In the case where an element forming layer provided over a supporting substrate is separated by using a peeling layer provided between the supporting substrate and the element forming layer, the quality of the peeling layer becomes important. That is, in the case where a supporting substrate and an element forming layer are separated from each other by removing a peeling layer, time required for removing the peeling layer is affected depending on a material used for the peeling layer and an etchant used for removing the peeling layer. In addition, in the case where a supporting substrate and an element forming layer are separated from each other by physical strength via a peeling layer, the adhesiveness between the supporting substrate and the element forming layer which are formed with the peeling layer interposed therebetween is affected depending on a material used for the peeling layer. Furthermore, in the case where a element forming layer constituted by a thin film transistor and the like is provided on a peeling layer, the property of the transistor may be affected and the reliability of a semiconductor device may be decreased depending on a material or the film quality of the peeling layer.

SUMMARY OF THE INVENTION

In view of the foregoing problem, the invention provides a manufacturing method of a semiconductor device at low cost and with high reliability.

In order to solve the foregoing problem, the following means is used in the invention.

According to a manufacturing method of a semiconductor device of the invention, a metal film is formed on a substrate, plasma treatment is applied to the metal film to form a metal oxide film on a surface of the metal film, an element forming layer is formed on the metal oxide film, an insulating film is formed to cover the element forming layer, an opening is formed in the insulating film and the element forming layer, the metal film and the metal oxide film are removed by injecting an etchant in the opening, and the element forming layer is peeled off the substrate. It is to be noted that the element forming layer in the invention includes at least a thin film transistor (TFT). Various kinds of integrated circuits such as a CPU (Central Processing Unit), a memory, or a microprocessor can be provided by using the thin film transistor. In addition, the element forming layer may have a mode having an antenna in addition to the thin film transistor. For example, the element forming layer constituted by a thin film transistor performs an operation by using an AC voltage generated at an antenna, and data can be transmitted to a reader/writer by modulating an AC voltage applied to the antenna. It is to be noted that the antenna may be formed together with the thin film transistor, or may be formed separately from the thin film transistor and provided so as to be electrically connected to the thin film transistor.

According to another manufacturing method of a semiconductor device of the invention, a metal film is formed on a substrate, plasma treatment is applied to the metal film to form a metal oxide film on a surface of the metal film, an element forming layer is formed on the metal oxide film, an insulating film is formed to cover the element forming layer, an opening is formed in the insulating film and the element forming layer, the metal film and the metal oxide film are removed so as to leave at least a part thereof by injecting an etchant in the opening, and the element forming layer is peeled off the substrate by a physical means (physical strength). It is to be noted that the physical means is a means recognized not by chemistry but by physics, which specifically means a dynamic means or a mechanical means having a step applicable to Law of Dynamic and a means of changing some sort of dynamic energy (mechanical energy). That is, peeling using the physical means is to peel by a shock (stress) externally using a human hand, pressure of a gas emitted from a nozzle, ultrasonic waves, a load using a cuneate member, or the like. In addition, if the adhesiveness between the substrate and the element forming layer which are formed with a peeling layer (the metal film and the metal oxide film, here) interposed therebetween is low, the element forming layer can be separated from the substrate without removing the peeling layer.

According to another manufacturing method of a semiconductor device of the invention, in the above structure, heat treatment may be applied to the metal film formed on the substrate to form the metal oxide film on the metal film.

According to another manufacturing method of a semiconductor device of the invention, a metal oxide film is formed on a substrate by sputtering in an atmosphere of oxygen, an element forming layer is formed on the metal oxide film, an insulating film is formed to cover the element forming layer, an opening is formed in the insulating film and the element forming layer, the metal oxide film is removed by injecting an etchant in the opening, and the element forming layer is peeled off the substrate. The metal oxide film is not necessarily required to be removed completely in this case; the element forming layer may be peeled off the substrate by a physical means after the metal oxide film is partially removed. In addition, the metal oxide film may be formed by a method such as CVD other than sputtering. It is to be noted that the metal oxide film may be formed on a substrate of glass or the like, or may be formed on a metal film.

According to the invention, a semiconductor device provided over a flexible substrate can be provided at low cost. In addition, according to the manufacturing method of a semiconductor device of the invention, a semiconductor device with high reliability can be obtained.

BRIEF DESCRIPTION OF THE DRAWINGS

FIGS. 6A to 6C are diagrams showing a manufacturing method of a semiconductor device of the invention.

FIGS. 8A and 8B are diagrams showing a manufacturing method of the semiconductor device of the invention.

DETAILED DESCRIPTION OF THE INVENTION

Figure 1A:
FIGS. 1A to 1E are diagrams showing a manufacturing method of a semiconductor device of the invention.

Although the invention will be fully described by way of embodiment modes and an embodiment with reference to the accompanying drawings, it is to be understood that various changes and modifications will be apparent to those skilled in the art. Therefore, unless such changes and modifications depart from the scope of the invention, they should be construed as being included therein. In the drawings, the same portions are denoted by the same reference numerals.

Embodiment Mode 1

In this embodiment mode, one example of a manufacturing method of a semiconductor device of the invention is described with reference to the drawings.

First, a metal film 11 is formed on a surface of a substrate 10 (FIG. 1A). The metal film 11 may be formed by a single layer or a plurality of layers stacked. For example, a tungsten (W) film is formed by sputtering. It is to be noted that an insulating film may be provided on the substrate 10 before the metal film 11 is formed. In particular, it is preferable to provide an insulating film between the substrate 10 and the metal film 11 when the contamination from the substrate may occur.

Figure 1B:
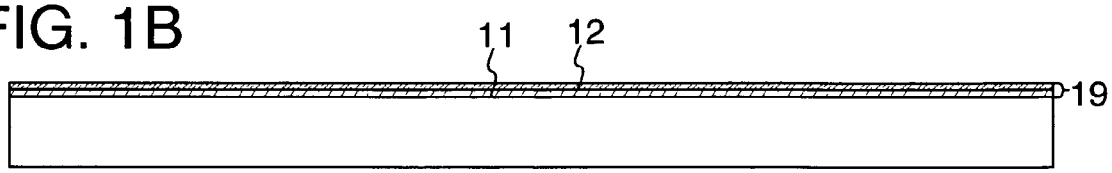

Next, plasma treatment is applied to the metal film 11 in an atmosphere of oxygen to form a metal oxide film 12 on a surface of the metal film 11 (FIG. 1B). The metal oxide film 12 is formed by using a metal oxide of a metal for the metal film 11. For example, when a tungsten film is used as the metal film 11, a tungsten oxide film is formed as the metal oxide film 12 on a surface of the tungsten film by performing plasma treatment. It is to be noted in this embodiment mode that a layer structured by the metal film 11 and the metal oxide film 12 is called a peeling layer 19.

Figure 1C:
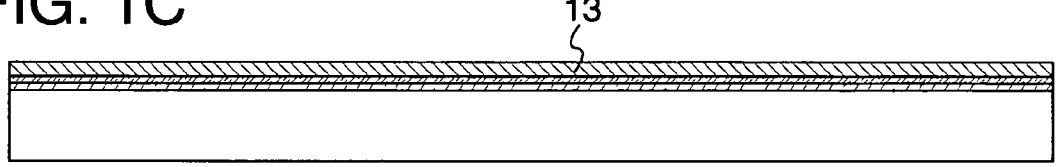

Then, an insulating film 13 is formed on the mental oxide film 12 (FIG. 1C). The insulating film 13 may be formed by a single layer or a plurality of layers stacked.

Figure 1D:
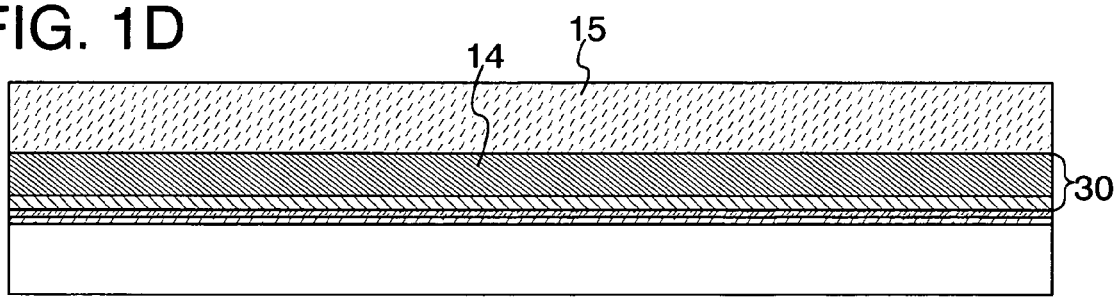

Subsequently, a layer 14 constituted by a thin film transistor and the like (hereinafter also described as a TFT layer 14) is formed on the insulating film 13. It is to be noted in this embodiment mode that a layer structured by the insulating film 13 and the TFT layer 14 is called an element forming layer 30. Then, an insulating film 15 is formed as a protective film to cover the element forming layer 30 (FIG. 1D). The insulating film 15 preferably covers side surfaces of the element forming layer 30. In addition, although the insulating film 15 is provided on the entire surface to cover the element forming layer 30 in this embodiment mode, it is not necessarily required to be provided on the entire surface and may be provided selectively.

Figure 1E:
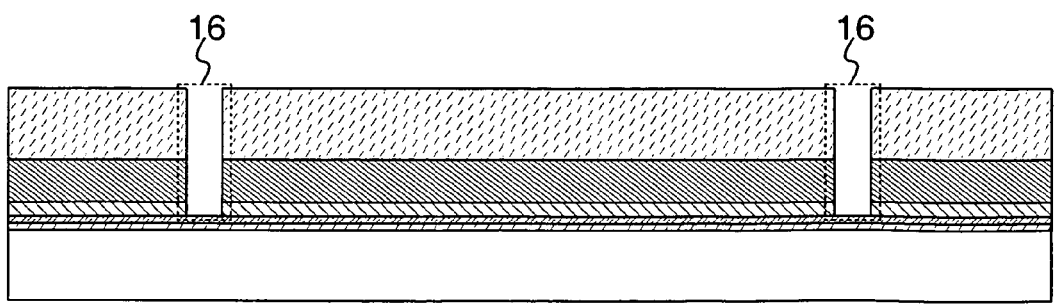

Next, an opening 16 is formed in the insulating film 15 and the element forming layer 30 to expose the peeling layer 19 (FIG. 1E). The opening 16 is preferably provided in a region where the thin film transistor or the like constituting the element forming layer 30 is not provided, or in an end surface of the substrate 10. It is to be noted that the opening 16 can be formed by laser light irradiation, grinding or cutting an end surface of a sample.

Figure 2A:
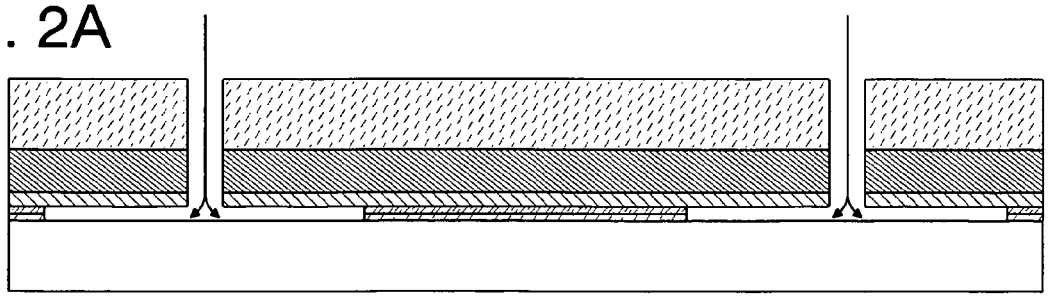
FIGS. 2A to 2D are diagrams showing a manufacturing method of the semiconductor device of the invention.

Then, an etchant is injected through the opening 16 to selectively remove the peeling layer 19 (FIG. 2A). The peeling layer 19 may be removed entirely or may be removed so as to leave a part thereof. By leaving a part of the peeling layer 19, the element forming layer 30 can be retained at the substrate 10 after the peeling layer is removed. In addition, when the treatment is performed while leaving a part of the peeling layer 19, consumption of the etchant can be reduced and processing time can be shortened, leading to the cost reduction and high efficiency.

Figure 2B:
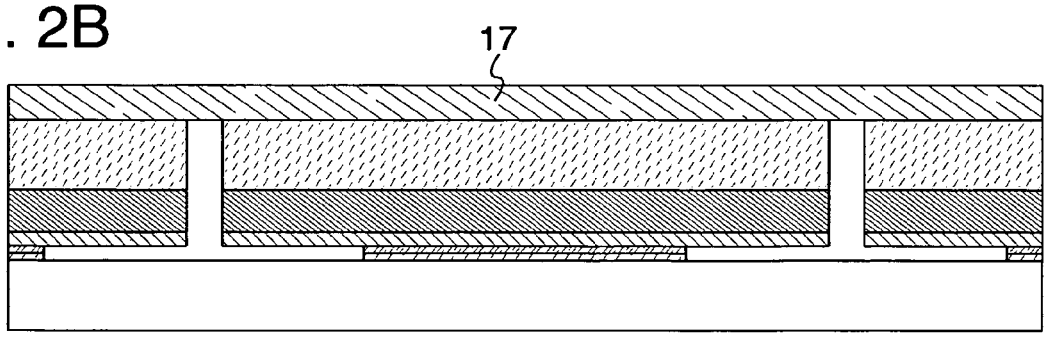

Next, a first sheet material 17 is provided on the insulating film 15 (FIG. 2B). At least one surface of the first sheet material 17 has adhesiveness, and the first sheet material 17 is attached to the insulating film 15 formed on the element forming layer 30.

Figure 2C:
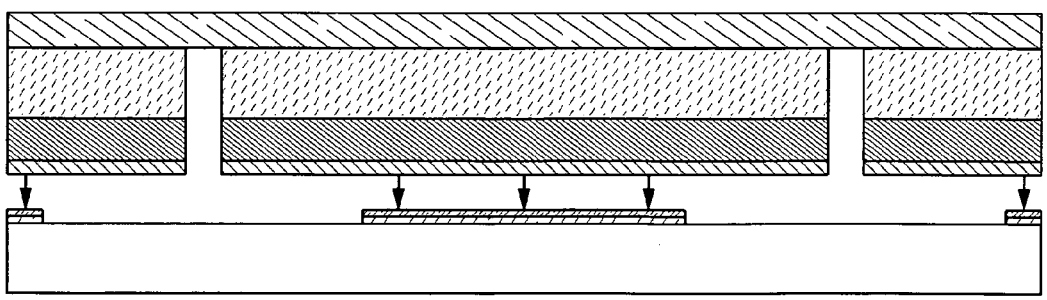

Subsequently, the element forming layer 30 is peeled off the substrate 10 (FIG. 2C). In the case where the peeling layer 19 is partially left between the substrate 10 and the element forming layer 30, the element forming layer 30 is peeled off the substrate 10 by a physical means. In this case, by using the peeling layer 19 provided by the aforementioned method, the element forming layer 30 can be easily peeled off the substrate 10 even by a physical means since the adhesiveness between the substrate 10 and the element forming layer 30 formed with the peeling layer 19 interposed therebetween has been decreased. It is to be noted that in the case where the adhesiveness between the substrate 10 and the element forming layer 30 formed with the peeling layer 19 interposed therebetween is low, the element forming layer 30 can be separated from the substrate 10 by physical strength after the opening 16 is formed to expose the peeling layer 19, without removing the peeling layer by using an etchant.

It is to be noted here that, when the substrate 10 and the element forming layer 30 are peeled off each other, the peeling is performed at an interface between the metal oxide film 12 and the insulating film 13 included in the element forming layer 30; however, depending on a condition such as a structure of the element forming layer 30 and stress applied in peeling, the peeling may be performed at an interface between the metal film 11 and the metal oxide film 12, an interface between the substrate 10 and the metal film 11, inside the metal oxide film 12, inside the metal film 11, or the like.

Figure 2D:
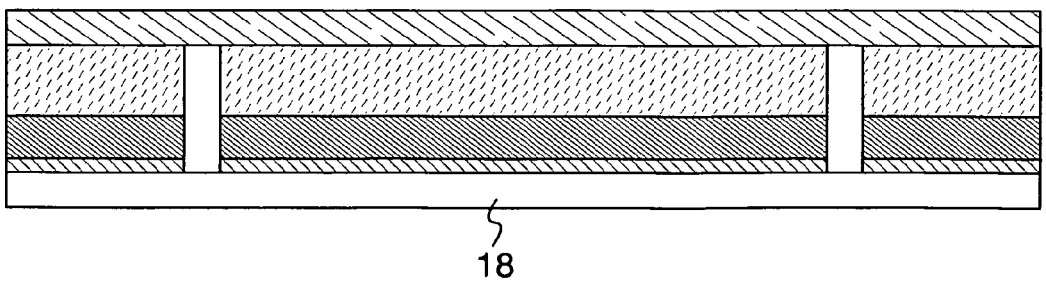

Subsequently, a second sheet material 18 is provided on the surface of the element forming layer 30 peeled off the substrate 10 (FIG. 2D). The second sheet material 18 is provided by performing one or both of heat treatment and pressure treatment after being attached to the element forming layer 30. By providing the second sheet material, the strength of the element forming layer 30 is enhanced and moisture, contaminant, and the like can be prevented from entering. It is to be noted that a similar sheet material to the second sheet material may be provided on the opposite side to the side provided with the second sheet material of the element forming layer in order to seal. In this case, when manufacturing a semiconductor device thinner, the sealing is preferably performed by providing a sheet material after the first sheet material is removed.

As a result of the above-described steps, a flexible semiconductor device can be manufactured. Hereinafter, a material and the like in each step are described in detail.

As the substrate 10, a glass substrate, a quartz substrate, a metal substrate, a stainless steel substrate with an insulating film formed on the surface, a plastic substrate having heat resistance against the treatment temperature of this step, or the like can be used. In the case of using the above-described substrates, an area and a shape thereof are not restricted so much; therefore, by using a rectangular substrate with at least one meter on a side, for example, the productivity can be drastically improved. This merit is greatly advantageous as compared to the case of using a circular silicon substrate. In addition, since the peeled substrate 10 can be reused in this embodiment mode, a semiconductor device can be manufactured at lower cost. There is such a merit that even in the case of using a quartz substrate of which cost is high, a semiconductor device can be manufactured at low cost by using the quartz substrate repeatedly.

The metal film 11 is formed in a single layer or a multilayer structure by a film using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), and iridium (Ir), an alloy material or a compound material containing the above-described element as its main component. In addition, these materials can be formed by using a known means (sputtering or various kinds of CVDs such as plasma CVD).

The insulating film provided between the substrate 10 and the metal film 11 can employ a single layer or a multilayer structure of an insulating film containing oxygen or nitrogen such as silicon oxide (SiOx), silicon nitride (SiNx), silicon oxynitride (SiOxNy) (x>y), and silicon nitride oxide (SiNxOy) (x>y). These insulating films can be formed by using a known means (sputtering or various kinds of CVDs such as plasma CVD).

The metal oxide film 12 is formed on a surface of the metal film 11 by applying plasma treatment to the surface of the metal film 11 in an atmosphere of oxygen. For example, when a tungsten film is formed by sputtering as the metal film 11, a metal oxide film formed of tungsten oxide can be formed on a surface of the tungsten film by applying plasma treatment to the tungsten film. In this case, the tungsten oxide is denoted by WOx and X is in the range of 2 to 3; there are $WO_2$ in the case where X is 2, $W_2O_5$ in the case where X is 2.5, $W_4O_{11}$ in the case where X is 2.75, $WO_3$ in the case where X is 3, and the like. The value of X is not limited to the above-described values, and tungsten oxide to be formed can be determined based on the etching rate and the like. In addition, other than the metal oxide film, metal nitride or metal oxynitride may be used. In this case, plasma treatment may be applied to the above-described metal film in an atmosphere of nitrogen or an atmosphere of nitrogen and oxygen.

The insulating film 13 can employ a single layer or a multilayer structure of an insulating film containing oxygen or nitrogen such as silicon oxide (SiOx), silicon nitride (SiNx), silicon oxynitride (SiOxNy) (x>y), and silicon nitride oxide (SiNxOy) (x>y) by using a known means (sputtering, plasma CVD, or the like). In the case where the insulating film 13 employs a two-layer structure, for example, a silicon nitride oxide film and a silicon oxynitride film are preferably formed as a first layer and a second layer respectively. In the case where the insulating film 13 employs a three-layer structure, for example, a silicon oxynitride film, a silicon nitride oxide film, and a silicon oxynitride film are preferably formed as a first layer, a second layer, and a third layer respectively.

The TFT layer 14 includes at least a thin film transistor (TFT) and the like. The TFT layer 14 can provide any kinds of integrated circuits such as a CPU, a memory, and a microprocessor by using the thin film transistor. In addition, the TFT layer 14 may have a mode having an antenna in addition to the thin film transistor. For example, an integrated circuit constituted by the thin film transistor performs an operation by using an AC voltage generated at an antenna, and data can be transmitted to a reader/writer by modulating an AC voltage applied to the antenna. It is to be noted that the antenna may be formed together with the thin film transistor, or may be formed separately from the thin film transistor and provided so as to be electrically connected to the thin film transistor.

It is to be noted that one of an amorphous semiconductor and a crystalline semiconductor may be used for the thin film transistor; however, if a higher-performance thin film transistor is used, the thin film transistor is preferably formed using a crystalline semiconductor. In this case, an amorphous semiconductor film is formed on the insulating film 13 by a known means (sputtering, LPCVD, plasma CVD, or the like), and the amorphous semiconductor film is crystallized by a known crystallization method (a laser crystallization, a thermal crystallization method using an RTA or an annealing furnace, a thermal crystallization method using a metal element for promoting crystallization, a method in which the laser crystallization is combined with the thermal crystallization method using a metal element for promoting crystallization, or the like) to form a crystalline semiconductor film.

In addition, a semiconductor film configuring the thin film transistor may have any structures; for example, an impurity region (including a source region, a drain region, and an LDD region) may be formed. The thin film transistor may be a p-channel type, an n-channel type, or a CMOS circuit. Furthermore, an insulating film (a sidewall) may be formed so as to contact a side surface of a gate electrode provided above the semiconductor film, and a silicide layer formed of nickel, molybdenum, cobalt, or the like may be formed for a source region, a drain region, and a gate electrode.

The insulating film 15 is formed by a film containing carbon such as DLC (Diamond Like Carbon), a film containing silicon nitride, a film containing silicon nitride oxide, a film made of a resin material such as epoxy or another organic material, or the like. It is to be noted that such a film is formed by a known means (sputtering, various kinds of CVDs such as plasma CVD, spin coating, a droplet discharging method, or a printing method) as the insulating film 15.

As the etchant, a gas or a liquid containing halogen fluoride or an interhalogen compound such as a chlorine trifluoride gas may be used. Besides, $CF_4$, $SF_6$, $NF_3$, $F_2$, or the like may be used.

As the first sheet material 17, a flexible film may be used and at least one surface thereof is provided with an adhesive surface. For example, a sheet material obtained by providing adhesive onto a base film used as a base material such as polyester can be used. As the adhesive, a resin material including an acrylic resin or the like or a material made of a synthetic rubber material can be used.

As the second sheet material 18, a flexible film can be used; for example, a film formed of polypropylene, polyester, vinyl, polyvinyl fluoride, vinyl chloride, or the like, paper made of a fibrous material, a stacked film structured by a base material film (polyester, polyamide, inorganic deposition film, paper, or the like) and an adhesive synthetic resin film (an acrylic synthetic resin, an epoxy synthetic resin, or the like), or the like can be used. It is to be noted that heat treatment and pressure treatment are applied by thermocompression bonding to the above-described film in the following manner; an adhesive layer which is provided in the outermost surface of the film or a layer (not an adhesive layer) which is provided in the outermost layer thereof is melted by heart treatment, and then pressure is applied, thereby the film is attached. It is to be noted that the element forming layer may be sealed with the first sheet material 17 and the second sheet material 18 by using the above-described materials for the first sheet material.

In this manner, according to this embodiment mode, an element forming layer is provided over a rigid substrate such as glass, and then the element forming layer is peeled off the substrate so that a flexible semiconductor device can be manufactured. Furthermore, by employing the method described in this embodiment mode, a peeling layer is formed and peeling is performed so that a semiconductor device with high reliability can be manufactured at low cost.

Embodiment Mode 2

In this embodiment mode, a manufacturing method of a semiconductor device different from the above embodiment mode is described with reference to the drawings.

Figure 4A:
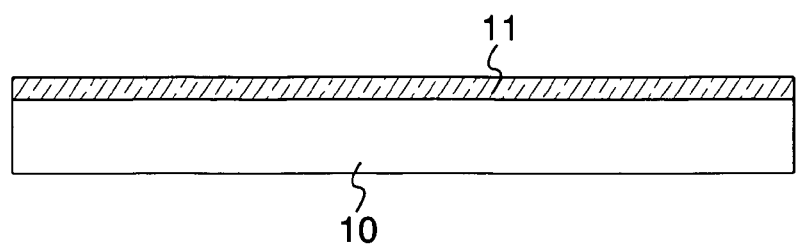
FIGS. 4A and 4B are diagrams showing a manufacturing method of a semiconductor device of the invention.

First, the metal film 11 is formed on a surface of the substrate 10 (FIG. 4A). The metal film 11 may be formed by a single layer or a plurality of layers stacked. For example, a tungsten (W) film is formed by sputtering. It is to be noted that an insulating film may be provided on the substrate 10 before the metal film 11 is formed. In particular, it is preferable to provide an insulating film between the substrate 10 and the metal film 11 when the contamination from the substrate may occur.

Figure 4B:
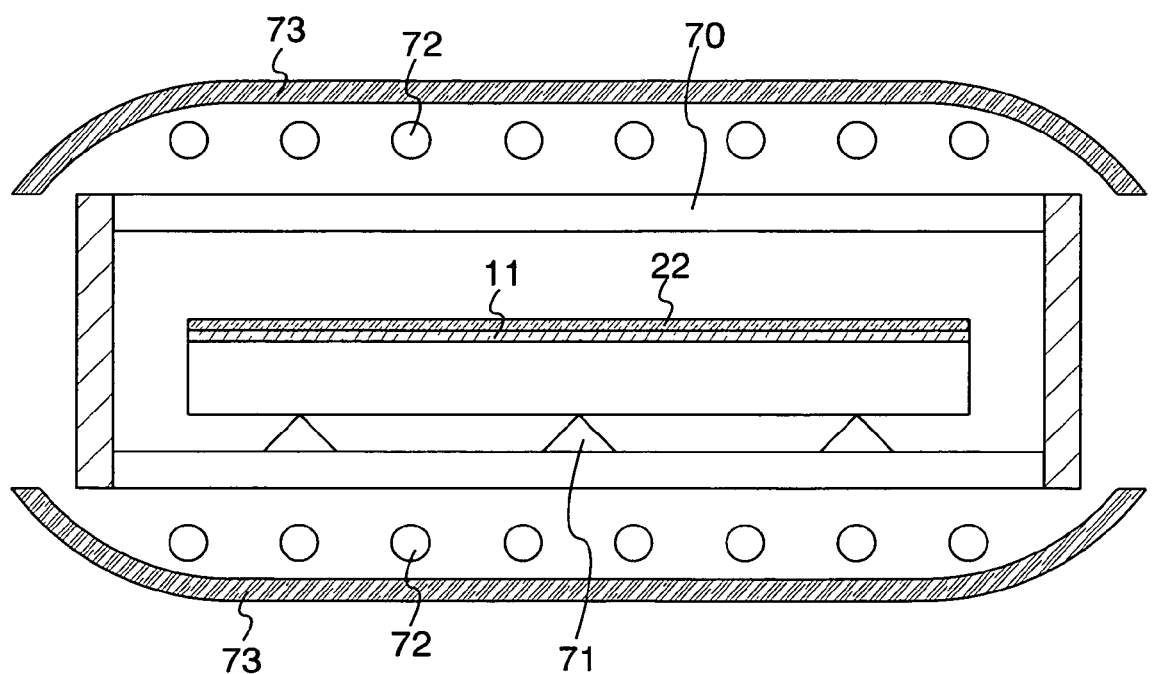

Then, in this embodiment mode, heat treatment using an RTA or an annealing furnace is performed to oxidize the metal film 11 so that a metal oxide film 22 is formed on a surface of the metal film 11. Described here is a case where the heat treatment is performed using an RTA (FIG. 4B). FIG. 4B shows an apparatus for heating a sample, which has a chamber 70, a supporting base 71, a heat source 72, a heat insulator 73, and the like. As the heat source 72, a heating wire such as a nickel chrome wire (a nichrome wire) and an iron chrome wire, or a lamp such as an infrared lamp and a halogen lamp is used.

First, the substrate 10 provided with the metal film 11 is set on the supporting base 71 in the chamber 70. Then, heat is applied using the heat source 72 to perform heat treatment onto the metal film 11 so that the metal oxide film 22 is formed on the surface of the metal film 11. By controlling the temperature or time of the heat treatment, the thickness of the metal oxide film 22 can be controlled. It is to be noted that a metal nitride film or a metal oxynitride film may be formed by performing the heat treatment in an atmosphere of nitride or an atmosphere of oxygen and nitride.

It is to be noted that FIG. 4B shows only one example, and any apparatuses can be employed as long as heat treatment is applied onto a metal film formed over a substrate to form a metal oxide film on the metal film. That is, it is important in this embodiment mode that a metal oxide film is formed on a surface of a metal film by performing heat treatment onto the metal film formed over a substrate. In addition, the substrate may be processed one by one, or a plurality of substrates may be processed simultaneously. In particular, in the case where many substrates are to be processed all at once, a batch annealing furnace can be employed.

After that, similar steps to those described in the above embodiment mode shown in FIGS. 1C to 2D are carried out so that a semiconductor device can be manufactured.

It is to be noted that this embodiment mode can be implemented freely combining with the above embodiment mode. That is, the materials and the forming method described in the above embodiment mode can be used by freely combining with this embodiment mode.

Embodiment Mode 3

In this embodiment mode, a manufacturing method of a semiconductor device different from the above embodiment modes is described with reference to the drawings.

Figure 5A:
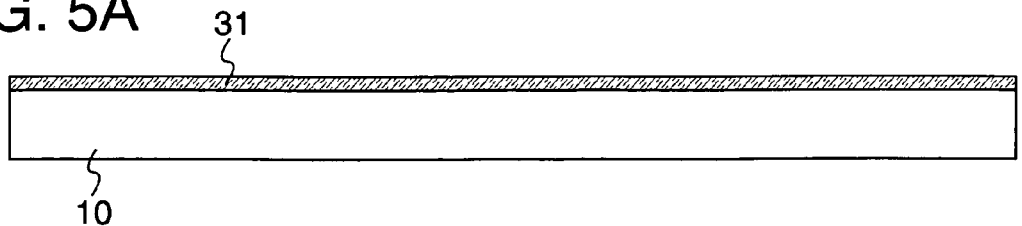
FIGS. 5A to 5E are diagrams showing a manufacturing method of a semiconductor device of the invention.

First, a metal oxide film 31 is formed on a surface of the substrate 10 by sputtering in an atmosphere of oxygen (FIG. 5A). For example, the sputtering is performed using tungsten as a target in an atmosphere of argon and oxygen to form a tungsten oxide film (WOx) on the substrate 10. Other than tungsten, the metal oxide film 31 may be formed in a single layer or a multilayer structure by a film using an element selected from molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), iridium (Ir), and silicon (Si), an alloy material or a compound material containing the above-described element as its main component.

Figure 5B:
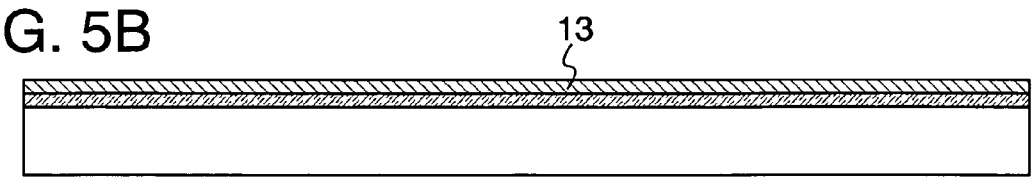

Next, the insulating film 13 is formed on the metal oxide film 31 (FIG. 5B). The insulating film 13 may be formed by a single layer or a plurality of layers stacked.

Figure 5C:
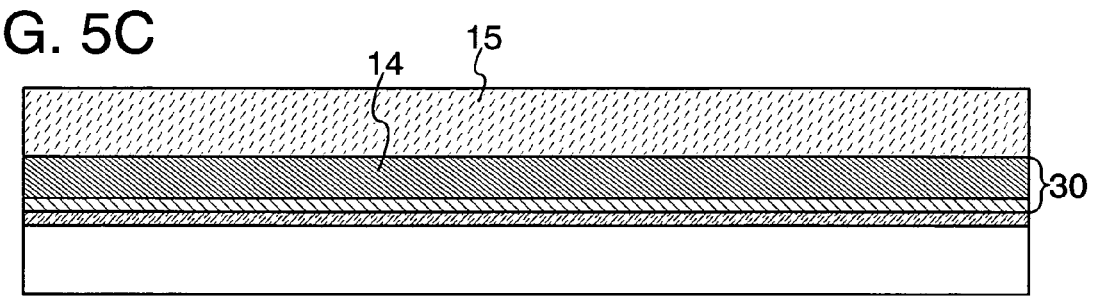

Subsequently, the layer 14 constituted by a thin film transistor and the like (the TFT layer 14) is formed on the insulating film 13. It is to be noted in this embodiment mode that a layer structured by the insulating film 13 and the TFT layer 14 is called the element forming layer 30 for convenience. Then, the insulating film 15 is formed as a protective film to cover the element forming layer 30 (FIG. 5C). The insulating film 15 preferably covers side surfaces of the element forming layer 30. In addition, although the insulating film 15 is provided on the entire surface to cover the element forming layer 30 in this embodiment mode, it is not necessarily provided on the entire surface and may be provided selectively.

Figure 5D:
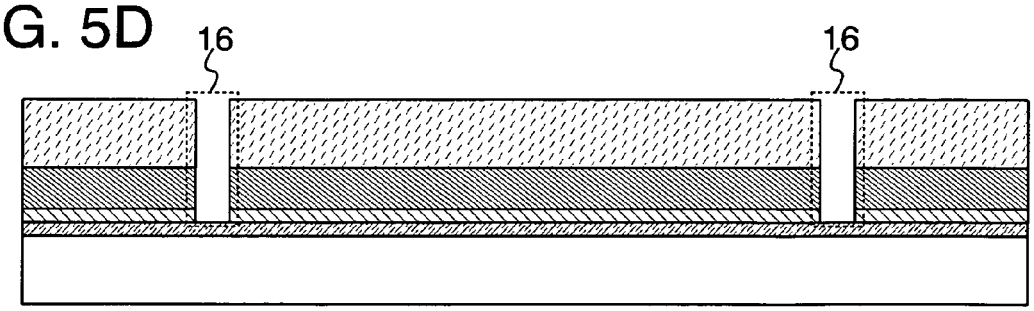

Next, the opening 16 is formed in the insulating film 15 and the element forming layer 30 to exposure the metal oxide film 31 (FIG. 5D). The opening 16 is preferably provided in a region where the thin film transistor or the like constituting the element forming layer 30 is not provided, or in an end surface of the substrate 10. It is to be noted that the opening 16 can be formed by laser light irradiation, grinding or cutting an end surface of a sample.

Figure 5E:
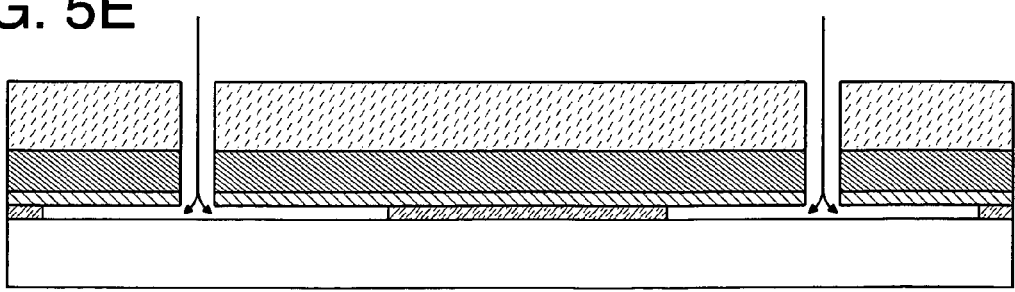

Then, an etchant that is for example halogen fluoride such as a chlorine trifluoride gas is injected through the opening 16 to selectively remove the metal oxide film 31 (FIG. 5E). The metal oxide film 31 may be removed entirely or may be removed so as to leave a part thereof. By leaving a part of the metal oxide film 31, the element forming layer 30 can be retained at the substrate 10 after the metal oxide film 31 is removed. In addition, when the treatment is performed while leaving a part of the metal oxide film 31, consumption of the etchant can be reduced and time required for the treatment can be shortened, leading to the cost reduction and high efficiency.

Next, a first sheet material is provided on the element forming layer 30 to separate the element forming layer 30 from the substrate 10 as described in the above embodiment mode. In this embodiment mode, the metal oxide film 31 functions as a peeling layer.

It is to be noted that the metal oxide film 31 is formed directly on the substrate 10 by sputtering in an atmosphere of oxygen in this embodiment mode; however, a metal film may be formed on the substrate 10 in advance, and then the metal oxide film 31 may be provided on the metal film. In this case, respective metal elements contained in the metal film and the metal oxide film may be different.

It is to be noted that this embodiment mode can be implemented freely combining with the above embodiment modes. That is, the materials and the forming methods described in the above embodiment modes can be used by freely combining with this embodiment mode.

Embodiment Mode 4

In the above embodiment modes, an example is described to manufacture the semiconductor device by sequentially forming a metal film, a metal oxide film, an insulating film, and an amorphous semiconductor film of a thin film transistor constituting an element forming layer. Described in this embodiment mode with reference to the drawings is a case where a conductive film, an insulating film, a semiconductor film, or the like are formed continuously.

Figure 3A:
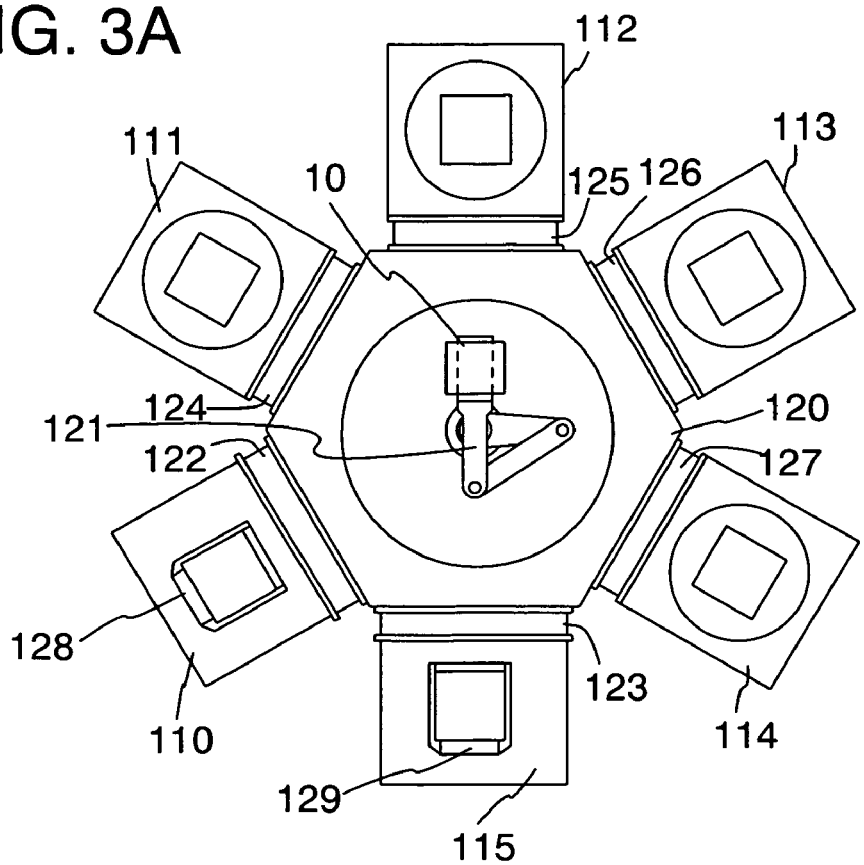
FIGS. 3A and 3B are diagrams each showing a continuous film-forming apparatus.

An example of an apparatus provided with a plurality of chambers is shown in FIG. 3A. It is to be noted that FIG. 3A is a top view of a constitution example of an apparatus (a continuous film-formation system) described in this embodiment mode.

The apparatus shown in FIG. 3A has a first chamber 111, a second chamber 112, a third chamber 113, and a fourth chamber 114 each of which has airtightness, load lock chambers 110 and 115, and a common chamber 120. Each chamber is provided with a vacuum evacuation pump and an inert gas induction system and has airtightness.

The load lock chambers 110 and 115 are chambers for carrying a sample (a substrate to be processed) to a system. The first to fourth chambers are chambers to form a conductive film, an insulating film, or a semiconductor film over the substrate 10 or to perform etching, plasma treatment, or the like. The common chamber 120 is provided for a sample in common for the load lock chambers 110 and 115 and the first to fourth chambers. In addition, gate valves 122 to 127 are provided between the common chamber 120 and the load lock chambers 110 and 115, and between the common chamber 120 and the first to fifth chambers 111 to 114, respectively. It is to be noted that a robot arm 121 is provided in the common chamber 120, which transfers a substrate to be processed to each chamber.

As a specific example, described below is a case where the metal film 11 is formed on the substrate 10 in the first chamber 111, the metal oxide film 12 is formed in the second chamber 112, the insulating film 13 is formed in the third chamber 113, and the amorphous semiconductor film is formed in the fourth chamber 114.

First, a cassette 128 containing a plurality of the substrates 10 is transferred to the load lock chamber 110. After the cassette 128 is transferred therein, a door of the load lock chamber 110 is closed. In this state, the gate valve 122 is opened to take out one substrate to be processed from the cassette 128, and then the substrate is disposed in the common chamber 120 by the robot arm 121. Alignment of the substrate 10 is performed in the common chamber 120 at this time.

Then, the gate valve 122 is closed and the gate valve 124 is opened to transfer the substrate 10 to the first chamber 111. A film formation process is performed in the first chamber 111 so that the metal film 11 is formed on the substrate 10; for example, a tungsten (W) film can be formed by plasma CVD or sputtering using W as a target in the first chamber 111.

After the metal film 11 is formed, the substrate 10 is taken out to the common chamber 120 by the robot arm 121, and transferred to the second chamber 112. In the second chamber 112, plasma treatment is applied in an atmosphere of oxygen to the metal film 11, thereby the metal oxide film 12 is formed on a surface of the metal film 11; for example, tungsten oxide (WOx) can be formed by performing plasma treatment to the tungsten film in the second chamber 112.

After the metal oxide film 12 is formed, the substrate 10 is taken out to the common chamber 120 by the robot arm 121, and transferred to the third chamber 113. In the third chamber 113, a film formation process is performed at 150 to 300° C., thereby the insulating film 13 is formed. The insulating film 13 can be formed by a single-layer film or a stacked-layer film of an insulating film having oxygen or nitrogen such as silicon oxide, silicon nitride, silicon oxynitride, and silicon nitride oxide. For example, in the third chamber 113, a silicon oxynitride film may be formed as a first-layer insulating film, a silicon nitride oxide film may be formed as a second-layer insulating film, and a silicon oxynitride film may be formed as a third-layer insulating film by plasma CVD. It is to be noted that sputtering using a target may be employed as well as plasma CVD.

After the insulating film 13 is formed, the substrate 10 is taken out to the common chamber 120 by the robot arm 121 and transferred to the fourth chamber 114. In the fourth chamber 114, a film formation process is performed at 150 to 300° C. and the amorphous semiconductor film is formed by plasma CVD. It is to be noted that the amorphous semiconductor film may be a microcrystalline semiconductor film, an amorphous germanium film, an amorphous silicon germanium film, or a stacked layer of these films. Further, heat treatment for reducing the hydrogen concentration may be omitted by setting a temperature for forming the amorphous semiconductor film at 350 to 500° C. It is to be noted that although plasma CVD is employed herein, sputtering using a target may be employed as well.

After the amorphous semiconductor film is formed in this manner, the substrate 10 is transferred to the load lock chamber 115 by the robot arm 121 to be stored in a cassette 129.

It is to be noted that FIG. 3A illustrates only an example. For example, a conductive film or an insulating film may be formed continuously after the amorphous semiconductor film is formed by increasing the number of chambers. Furthermore, the metal oxide film 22 may be formed by heat treatment in the second chamber 112 as described in Embodiment Mode 2. Further alternatively, the metal oxide film 31 may be formed on the substrate 10 by sputtering in an atmosphere of oxygen in the first chamber 111 as described in Embodiment Mode 3. That is, the invention can be implemented by using the steps and materials described in the above-described embodiment modes and freely combining with the apparatus shown in FIG. 3A. In addition, although description is made on the case where single type chambers are employed for the first to fourth chambers 111 to 114 in FIG. 3A, constitution to process a plurality of substrates all at once by employing a batch chamber may be adopted.

Next, a different constitution from that shown in FIG. 3A is described with reference to FIG. 3B. Specifically, films are continuously stacked using a plurality of chambers in FIG. 3A, while films are continuously formed within one chamber while keeping the vacuum in FIG. 3B.

Figure 3B:
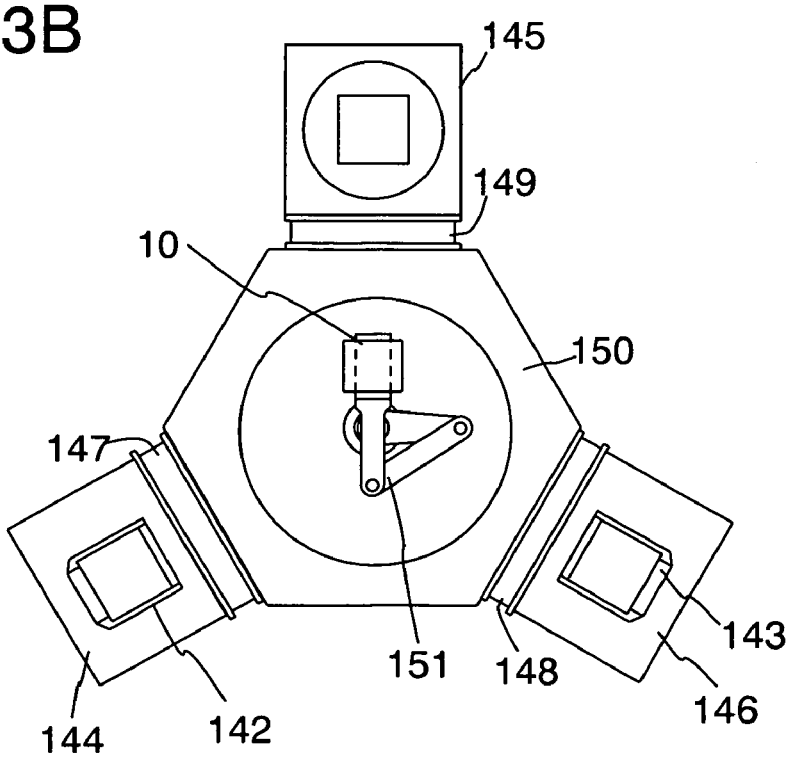

The apparatus shown in FIG. 3B has load lock chambers 144 and 146, a chamber 145, and a common chamber 150. Each chamber is provided with a vacuum evacuation pump and an inert gas induction system. The common chamber 150 is provided for a sample in common for the load lock chambers 144 and 146 and the chamber 145. In addition, gate valves 147 to 149 are provided between the common chamber 150 and the load lock chambers 144 and 146, and between the common chamber 150 and the chamber 145, respectively. It is to be noted that a robot arm 151 is provided in the common chamber 150, which transfers a substrate to be processed to each chamber.

Hereinafter, as a specific example, a case where the metal film 11, the metal oxide film 12, the insulating film 13, and the amorphous semiconductor film are formed on the substrate 10 is described.

First, a cassette 142 containing a plurality of the substrates 10 is transferred to the load lock chamber 144. After the cassette 142 is transferred therein, a door of the load lock chamber 144 is closed. In this state, the gate valve 147 is opened to take out one substrate to be processed from the cassette 142, and then the substrate is disposed in the common chamber 150 by the robot arm 151. Alignment of the substrate 10 is performed in the common chamber 150 at this time.

Then, the gate valve 147 is closed, and the gate valve 149 is opened to transfer the substrate 10 to the chamber 145 by the robot arm 151. The chamber 145 is provided with a plurality of targets, and a reaction gas is changed sequentially so that the metal film 11, the metal oxide film 12, the insulating film 13, and the amorphous semiconductor film can be continuously stacked on the substrate 10.

After that, the substrate 10 is transferred to the load lock chamber 146 by the robot arm 151 to be stored in the cassette 143.

It is to be noted that FIG. 3B illustrates only an example. For example, a conductive film or an insulating film may be formed continuously after the amorphous semiconductor film is formed. Furthermore, the metal oxide film 22 may be formed by heat treatment as described in Embodiment Mode 2. Further alternatively, the metal oxide film 31 may be formed on the substrate 10 by sputtering in an atmosphere of oxygen as described in Embodiment Mode 3. That is, the invention can be implemented by using the steps and materials described in the above-described embodiment modes and freely combining with the apparatus shown in FIG. 3B. In addition, although description is made on the case where a single type chamber is employed for the chamber 145 in FIG. 3B, constitution to process a plurality of substrates all at once by employing a batch chamber may be adopted.

By employing the apparatus shown in FIG. 3B, films are continuously formed within the same chamber, thereby contamination due to transfer of the substrate can be prevented.

By employing the apparatus described in this embodiment mode, a conductive film, an insulating film, a semiconductor film, or the like can be continuously formed without exposing them to air. Therefore, contaminant can be prevented from being mixed and the manufacturing efficiency can be improved.

Embodiment Mode 5

In this embodiment mode, a manufacturing method of a semiconductor device of the invention which includes a thin film transistor, a memory element, and an antenna is described with reference to the drawings.

First, a peeling layer 702 is formed on one surface of a substrate 701 (FIG. 6A).

As the substrate 701, a glass substrate, a quartz substrate, a metal substrate, a stainless steel substrate with an insulating film formed on one surface thereof, a plastic substrate having heat resistance against the treatment temperature of this step, or the like may be used. In the case of the above-described substrates, an area and a shape thereof are not particularly restricted; therefore, by using a rectangular substrate with at least one meter on a side, for example, the productivity can be drastically improved. This merit is greatly advantageous as compared to the case of using a circular silicon substrate. In addition, the peeling layer 702 is formed on an entire surface of the substrate 701 in this step; however, the peeling layer 702 may be selectively provided as needed by patterning by a photolithography method after the peeling layer is formed on the entire surface of the substrate 701. It is to be noted that the peeling layer 702 is formed to contact the substrate 701; however, an insulating film may be formed as a base film to contact the substrate 701 as needed and the peeling layer 702 may be formed to contact the insulating film.

The peeling layer 702 is formed by a metal film and a metal oxide film thereof. The metal film is formed in a single layer or a multilayer structure by a film using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), and iridium (Ir), an alloy material or a compound material containing the abovedescribed element as its main component, in a single layer or a multilayer structure by using a known means (sputtering, plasma CVD, or the like). The metal oxide film is formed on a surface of the metal film by applying plasma treatment to the metal film in an atmosphere of oxygen, or by applying heat treatment to the metal film in an atmosphere of oxygen. Note that a metal oxynitride film may be used instead of the metal oxide film.

In the case where the metal layer employs a single layer structure, a tungsten layer, a molybdenum layer, or a layer containing a mixture of tungsten and molybdenum is formed for example. Then, a layer containing oxide or oxynitride of tungsten, a layer containing oxide or oxynitride of molybdenum, or a layer containing oxide or oxynitride of a mixture of tungsten and molybdenum is formed on the metal film. It is to be noted that a mixture of tungsten and molybdenum corresponds to an alloy of tungsten and molybdenum.

Alternatively, the peeling layer 702 may be formed by forming a metal film on the substrate 701, and then forming a metal oxide film by sputtering using the above-mentioned materials of the metal film as a target in an atmosphere of oxygen. In this case, the metal film and the metal oxide film may be formed using different metal elements from each other as well. Further alternatively, a metal oxide film directly formed on the substrate 701 may be used as the peeling layer 702.

Next, a base insulating film 703 is formed to cover the peeling layer 702.

The insulating film 703 is formed by a film containing oxide of silicon or nitride of silicon in a single layer or a multilayer structure by a known means (sputtering, plasma CVD, or the like). In the case where the base insulating film employs a two-layer structure, a silicon nitride oxide film may be formed as a first layer, and a silicon oxynitride film may be formed as a second layer, for example. In the case where the base insulating film employs a three-layer structure, a silicon oxide film, a silicon nitride oxide film, and a silicon oxynitride film may be formed as a first layer, a second layer, and a third layer respectively. Alternatively, a silicon oxynitride film, a silicon nitride oxide film, and a silicon oxynitride film may be formed as a first layer, a second layer, and a third layer respectively. The base insulating film functions as a blocking film for preventing impurities from the substrate 701.

Subsequently, an amorphous semiconductor film 704 (e.g., a film containing amorphous silicon) is formed on the insulating film 703. The amorphous semiconductor film 704 is formed with a thickness of 25 to 200 nm (preferably 30 to 150 nm) by a known means (sputtering, LPCVD, plasma CVD, or the like). The amorphous semiconductor film 704 is crystallized by a known crystallization method (a laser crystallization method, a thermal crystallization method using an RTA or an annealing furnace, a thermal crystallization method using a metal element for promoting crystallization, a method in which the laser crystallization method is combined with the thermal crystallization method using a metal element for promoting crystallization, or the like) to form a crystalline semiconductor film. The obtained crystalline semiconductor film is then patterned into a desired shape, thereby crystalline semiconductor films 706 to 710 are formed (FIG. 6B). It is to be noted that the peeling layer 702, the insulating film 703, and the amorphous semiconductor film 704 can be formed continuously as shown in FIGS. 3A and 3B.

Hereinafter, an example of a manufacturing step of the crystalline semiconductor films 706 to 710 is described briefly. First, an amorphous semiconductor film is formed with a thickness of 66 nm by plasma CVD. Next, a solution containing nickel that is a metal element for promoting crystallization is applied onto the amorphous semiconductor film, and dehydrogenation treatment (at 500° C., for 1 hour) and thermal crystallization treatment (at 550° C., for 4 hours) are performed to the amorphous semiconductor film, thereby a crystalline semiconductor film is formed. After that, the crystalline semiconductor film is irradiated with laser light as needed, and patterning treatment using a photolithography method is performed to form the crystalline semiconductor films 706 to 710.

In the case where the laser crystallization method is employed for forming the crystalline semiconductor film, a gas laser or a solid laser of a continuous oscillation or a pulsed oscillation is used. As the gas laser, an excimer laser, a YAG laser, a $YVO_4$ laser, a YLF laser, a $YAlO_3$ laser, a glass laser, a ruby laser, or a Ti: sapphire laser is used. As the solid laser, a laser using a crystal such as YAG, $YVO_4$, YLF, and $YAlO_3$ doped with Cr, Nd, Er, Ho, Ce, Co, Ti, or Tm is used. In particular, by irradiating a fundamental wave of the continuous oscillation laser, or a harmonic wave from second to fourth harmonic waves of the fundamental wave, large grain crystals can be obtained. For example, a second harmonic (532 nm) or a third harmonic (355 nm) of a Nd: $YVO_4$ laser (a fundamental wave of 1064 nm) can be used. It is to be noted that laser light of a fundamental wave of a continuous wave laser and laser light of a harmonic of a continuous wave laser may be irradiated, or laser light of a fundamental wave of a continuous wave laser and laser light of a harmonic of a pulsed laser may be irradiated. By irradiating a plurality of kinds of laser light, energy can be compensated. In addition, if a pulse oscillation laser oscillates the laser beam with a repetition rate for irradiating the next pulsed laser light until a semiconductor film which has been melted by the previous laser light is solidified, crystal grains grown continuously in the scanning direction can be formed. That is, a pulsed oscillation laser which can be used here has a repetition rate a lower limit of which is set such that the pulse repetition period is shorter than a period for solidifying completely the semiconductor film which has been melted. As such laser, pulsed oscillation laser light having a repetition rate of 10 MHz or more may be used.

In addition, the crystallization of the amorphous semiconductor film by using the metal element for promoting crystallization is advantageous in that the crystallization can be performed at low temperature in short time and the direction of crystals becomes uniform, while there is a problem in that the property is not stable because the off current is increased due to a residue of the metal element in the crystalline semiconductor film. Therefore, it is preferable to form an amorphous semiconductor film as a gettering site on the crystalline semiconductor film. In order to form a gettering site, the amorphous semiconductor film is required to contain an impurity element such as phosphorous and argon, and therefore, it is preferably formed by sputtering by which argon can be contained at a high concentration. After that, heat treatment (an RTA method, thermal annealing using an annealing furnace, or the like) is performed to diffuse the metal element into the amorphous semiconductor film, and the amorphous semiconductor film containing the metal element is removed. In this manner, the content of the metal element in the crystalline semiconductor film can be reduced or removed.

Then, a gate insulating film 705 is formed to cover the crystalline semiconductor films 706 to 710. The gate insulating film 705 is formed by a single layer or stacked layer of a film containing oxide of silicon or nitride of silicon by a known means (plasma CVD or sputtering). Specifically, a film containing silicon oxide, a film containing silicon oxynitride, or a film containing silicon nitride oxide is formed in a single layer or stacked layer structure.

Subsequently, a first conductive film and a second conductive film are stacked on the gate insulating film 705. The first conductive film is formed with a thickness of 20 to 100 nm by a known means (plasma CVD or sputtering). The second conductive film is formed with a thickness of 100 to 400 nm by a known means. The first conductive film and the second conductive film are formed by using an element selected from tantalum (Ta), tungsten (W), titanium (Ti), molybdenum (Mo), aluminum (Al), copper (Cu), chromium (Cr), niobium (Nb), or the like, an alloy material or a compound material containing the above-described element as its main component. Alternatively, a semiconductor material, typically polycrystalline silicon doped with an impurity element such as phosphorus, may be used. As a combination of the first conductive film and the second conductive film, a titanium nitride (TaN) film and a tungsten (W) film, a tungsten nitride (WN) film and a tungsten film, a molybdenum nitride (MoN) film and a molybdenum (Mo) film, or the like can be used for example. Since tungsten, titanium nitride, or the like has high heat resistance, heat treatment for thermal activation can be performed after the first conductive film and the second conductive film are formed. Alternatively, in the case of employing a three-layer structure instead of a two-layer structure, a stacked layer structure of a molybdenum film, an aluminum film, and a molybdenum film may be employed.

Then, a resist mask is formed by a photolithography method and etching treatment for forming a gate electrode and a gate line is performed, thereby conductive films (also referred to as gate electrodes) 716 to 725 each functioning as a gate electrode are formed.

Next, a resist mask is newly formed by a photolithography method. Then, an impurity element imparting n-type conductivity is added into the crystalline semiconductor films 706, and 708 to 710 at a low concentration by an ion doping method or an ion implantation method to form n-type impurity regions 711, and 713 to 715 and channel forming regions 780, and 782 to 784. An element belonging to group 15 of Periodic Table may be used for the impurity element imparting n-type conductivity and, for example, phosphorus (P) or arsenic (As) is used.

Subsequently, a resist mask is newly formed by a photolithography method. Then, an impurity element imparting p-type conductivity is added into the crystalline semiconductor film 707 to form a p-type impurity region 712 and a channel forming region 781. For example, boron (B) is used for the impurity element imparting p-type conductivity.

Then, an insulating film is formed so as to cover the gate insulating film 705 and the conductive films 716 to 725. The insulating film is formed by a single layer or stacked layer of a layer containing an inorganic material such as silicon, oxide of silicon, and nitride of silicon, or a layer containing an organic material such as an organic resin by a known means (plasma CVD or sputtering). Next, the insulating film is selectively etched by anisotropic etching which is mainly in the vertical direction, thereby insulating films (also referred to as sidewalls) 739 to 743 in contact with the side surfaces of the conductive films 716 to 725 are formed (see FIG. 6C). Simultaneously with the formation of the insulating films 739 to 743, insulating films 734 to 738 are formed by etching the insulating film 705. The insulating films 739 to 743 are used as masks for doping to form an LDD (Lightly Doped Drain) region subsequently.

Then, a resist mask is formed by a photolithography method. Using the resist mask and the insulating films 739 to 743 as masks, an impurity element imparting n-type conductivity is added into the crystalline semiconductor films 706, and 708 to 710 so that first n-type impurity regions (also referred to as LDD regions) 727, 729, 731, and 733 and second n-type impurity regions 726, 728, 730, and 732 are formed. The concentration of the impurity element in the first n-type impurity regions 727, 729, 731, and 733 is lower than the concentration of the impurity element in the second n-type impurity regions 726, 728, 730, and 732. As a result of the above-described steps, n-type thin film transistors 744, and 746 to 748 and a p-type thin film transistor 745 are completed.

It is to be noted that there are the following two methods for forming the LDD region. In one method, a gate electrode is formed in a stacked layer structure having two or more layers, and taper etching or anisotropic etching is performed to the gate electrode and a conductive film of the lower layer included in the gate electrode is used as a mask. In the other method, a sidewall insulating film is used as a mask. A thin film transistor that is formed by the former method has a structure in which an LDD region is overlapped with a gate electrode with a gate insulating film interposed therebetween; however, this structure which utilizes taper etching or anisotropic etching of the gate electrode is difficult to control the width of the LDD region, and the LDD region may not be formed if the etching step is not performed preferably. On the other hand, the latter method which uses a sidewall insulating layer as a mask is, as compared to the former method, easy to control the width of the LDD region, thereby the LDD region can be formed certainly.

Figure 7A:
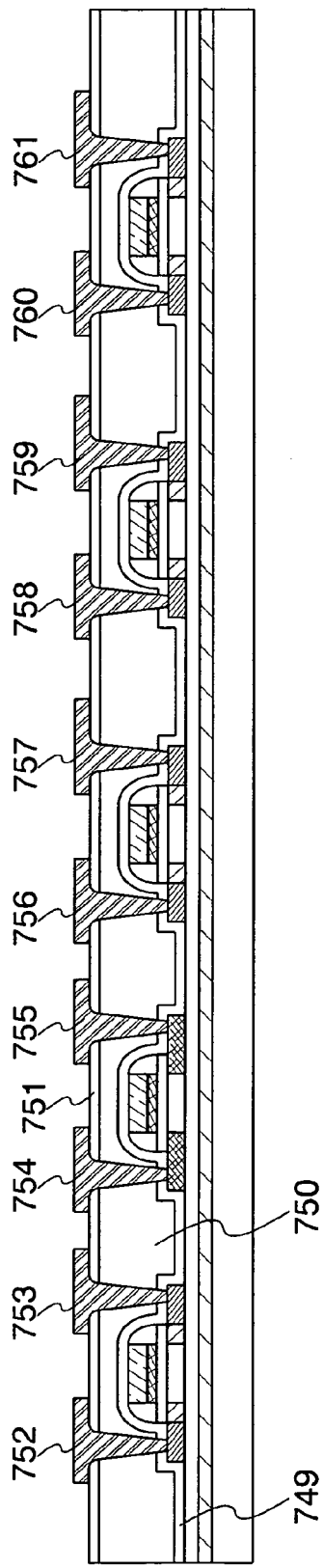
FIGS. 7A and 7B are diagrams showing a manufacturing method of the semiconductor device of the invention.

Then, an insulating film is formed in a single layer or stacked layer structure so as to cover the thin film transistors 744 to 748 (see FIG. 7A). The insulating film covering the thin film transistors 744 to 748 is formed by a single layer or stacked layer using an inorganic material such as oxide of silicon and nitride of silicon, an organic material such as polyimide, polyamide, benzocyclobutene, acrylic, epoxy resin, and siloxane, or the like by a known means (an SOG method, a droplet discharging method, or the like). For example, in the case where the insulating layer covering the thin film transistors 744 to 748 employs a three-layer structure, a film containing silicon oxide may be formed as a first-layer insulating film 749, a film containing a resin may be formed as a second-layer insulating film 750, and a film containing silicon nitride may be formed as a third-layer insulating film 751. Siloxane material contains a Si—O—Si bond. Siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

It is to be noted that before the insulating films 749 to 751 are formed or after one or a plurality of thin films of the insulating films 749 to 751 are formed, heat treatment for recovering the crystallinity of the semiconductor film, for activating the impurity element which has been added into the semiconductor film, or for hydrogenating the semiconductor film is preferably performed. For the heat treatment, a thermal annealing method, a laser annealing method, an RTA method, or the like is preferably adopted.

Then, the insulating films 749 to 751 are etched by a photolithography method, thereby contact holes are formed to expose the n-type impurity regions 726, and 728 to 732 and the p-type impurity region 785. Subsequently, a conductive film is formed so as to fill the contact holes and patterned to form conductive films 752 to 761 each functioning as a source or drain wiring.

The conductive films 752 to 761 are formed by a single layer or stacked layer using an element selected from titanium (Ti), aluminum (Al), and neodymium (Nd), an alloy material or a compound material containing the above-described element as its main component by a known means (plasma CVD or sputtering). An alloy material containing aluminum as its main component corresponds to an alloy material containing nickel whose main component is aluminum or an alloy material containing nickel and one or both of carbon and silicon whose main component is aluminum, for example. Each of the conductive films 752 to 761 preferably employs, for example, a stacked layer structure of a barrier film, an aluminum-silicon (Al—Si) film, and a barrier film, or a stacked layer structure of a barrier film, an aluminum-silicon (Al—Si) film, a titanium nitride (TiN) film, and a barrier film. It is to be noted that a barrier film corresponds to a thin film formed by using titanium, nitride of titanium, molybdenum, or nitride of molybdenum. Aluminum and aluminum silicon which have the low resistance and are inexpensive are optimal materials for forming the conductive films 752 to 761. In addition, generation of a hillock of aluminum or aluminum silicon can be prevented when upper and lower barrier layers are provided. Further, when the barrier film is formed by using titanium that is a high-reducible element, even if a thin natural oxide film is formed on the crystalline semiconductor film, the natural oxide film is reduced so that preferable contact with the crystalline semiconductor film can be obtained.

Figure 7B:
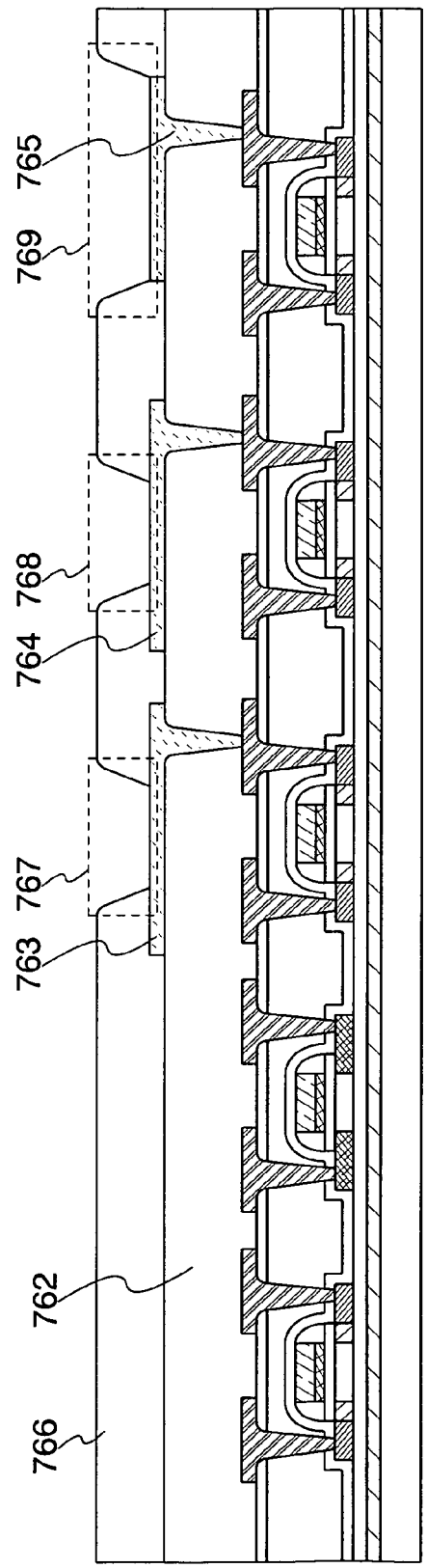

Next, an insulating film 762 is formed so as to cover the conductive films 752 to 761 (see FIG. 7B). The insulating film 762 is formed by a single layer or stacked layer using an inorganic material or an organic material by a known means (an SOG method, a droplet discharging method, or the like). The insulating film 762 is preferably formed with a thickness of 0.75 to 3 µm.

Subsequently, the insulating film 762 is etched by a photolithography method so that contact holes to expose the conductive films 757, 759, and 761 are formed. Then, a conductive film is formed so as to fill the contact holes. The conductive film is formed by a known means (plasma CVD or sputtering) by using a conductive material. The conductive film is patterned to form conductive films 763 to 765. It is to be noted that the conductive films 763 to 765 correspond to one conductive film of a pair of conductive films included in a memory element. Therefore, the conductive films 763 to 765 are preferably formed by a single layer or stacked layer using titanium, an alloy material or a compound material containing titanium as its main component. Titanium which has the low resistance enables size reduction of the memory element, thereby highly integration can be realized. In addition, in the photolithography step for forming the conductive films 763 to 765, it is preferable to perform wet etching in order to prevent damage to the thin film transistors 744 to 748 that are lower layers; hydrogen fluoride (HF) or ammonia hydroxide-hydrogen peroxide-water mixture is preferably used as the etchant.

Then, an insulating film 766 is formed so as to cover the conductive films 763 to 765. The insulating film 766 is formed by a single layer or stacked layer using an inorganic material or an organic material by a known means (an SOG method, a droplet discharging method, or the like). In addition, the insulating film 766 is preferably formed with a thickness of 0.75 to 3 µm. The insulating film 766 is then etched by a photolithography method so that contact holes 767 to 769 are formed to expose the conductive films 763 to 765 respectively.

Subsequently, a conductive film 786 functioning as an antenna which is in contact with the conductive film 765 is formed (see FIG. 8A). The conductive film 786 is formed using a conductive material by a known means (plasma CVD, sputtering, printing, or a droplet discharging method). Preferably, the conductive film 786 is formed by a single layer or stacked layer using an element selected from aluminum (Al), titanium (Ti), silver (Ag), or copper (Cu), an alloy material or a compound material containing the above-described element as its main component. Specifically, screen printing is performed using a paste containing silver and then heat treatment at 50 to 350° C. is performed to form the conductive film 786. Alternatively, an aluminum film is formed by sputtering, and is patterned to form the conductive film 786. The patterning of the aluminum film is preferably performed by wet etching, and heat treatment at 200 to 300° C. is preferably performed after the wet etching.

Then, an organic compound layer 787 is formed in contact with the conductive films 763 and 764 (FIG. 8B). The organic compound layer 787 is formed by a known means (a droplet discharging method, a vapor deposition method, or the like). Subsequently, a conductive film 771 is formed in contact with the organic compound layer 787; it is formed by a known means (sputtering or a vapor deposition method).

As a result of the above-described steps, a memory element portion 789 which is structured by the conductive film 763, the organic compound layer 787, and the conductive film 771, and a memory element portion 790 which is structured by the conductive film 764, the organic compound layer 787, and the conductive film 771 are completed.

It is to be noted that according to the manufacturing step described above, a step for forming the organic compound layer 787 is carried out after a step for forming the conductive film 786 functioning as an antenna because the heat resistance of the organic compound layer 787 is not high.

Subsequently, so as to cover the memory element portions 789 and 790 and the conductive film 786 functioning as an antenna, an insulating film 772 functioning as a protective film is formed by a known means (an SOG method, a droplet discharging method, or the like). The insulating film 772 is formed by a film containing carbon such as DLC (Diamond Like Carbon), a film containing silicon nitride, a film containing silicon nitride oxide, or an organic material, and preferably formed of an epoxy resin.

Figure 9A:
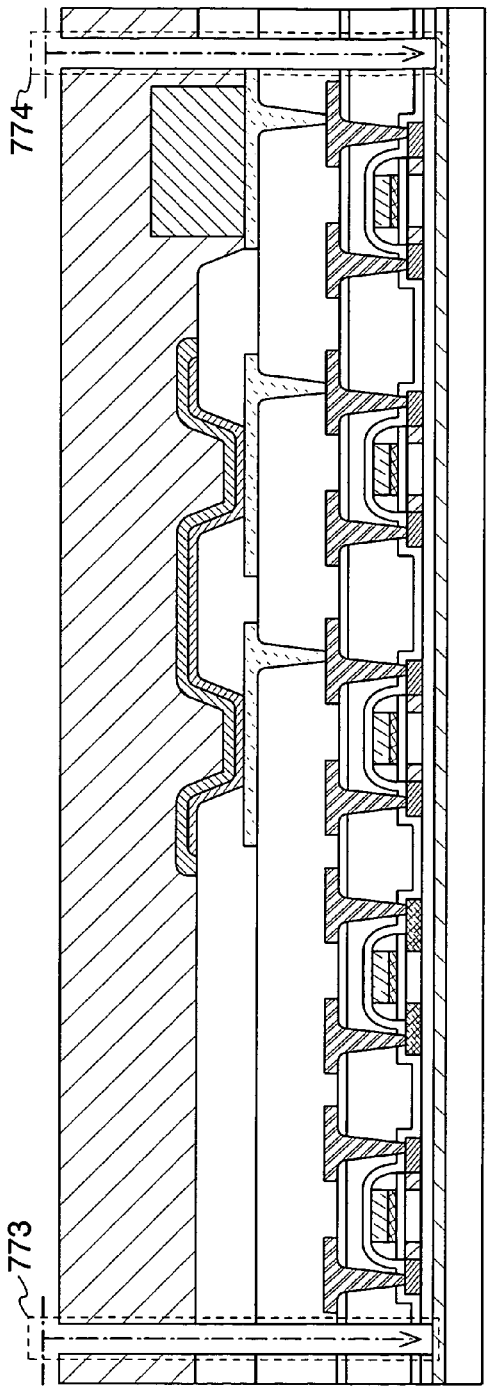
FIGS. 9A and 9B are diagrams showing a manufacturing method of the semiconductor device of the invention.

The insulating film is then etched by a photolithography method or laser light irradiation to expose the peeling layer 702, thereby openings 773 and 774 are formed (FIG. 9A).

Figure 9B:
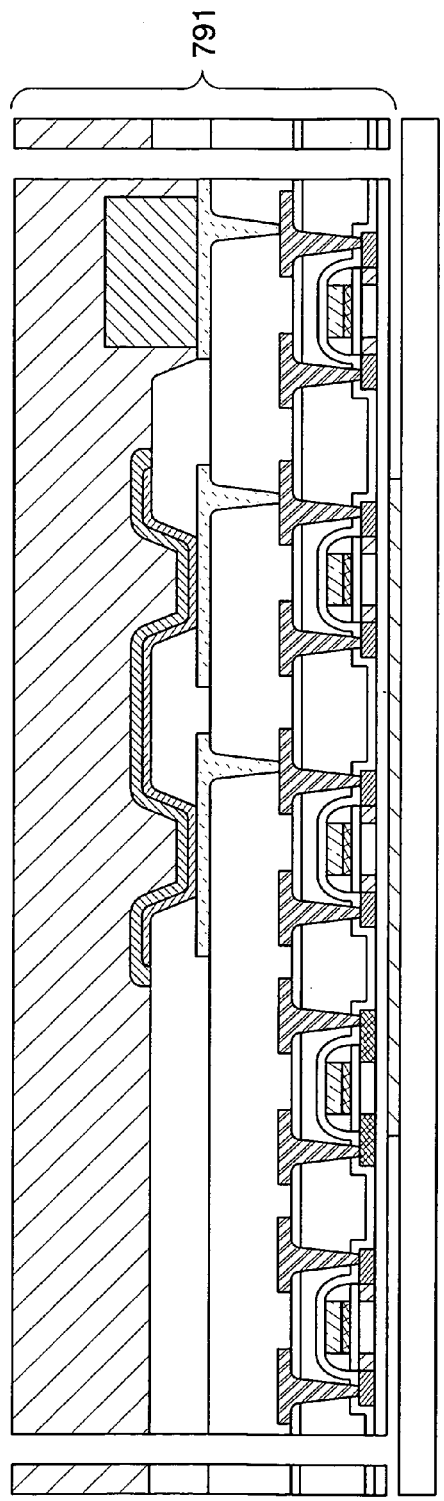

Subsequently, the peeling layer 702 is removed by injecting an etchant in the openings 773 and 774 (FIG. 9B). As the etchant, a gas or a liquid containing halogen fluoride or an interhalogen compound is used; for example, chlorine trifluoride ($ClF_3$) as a gas containing halogen fluoride is used. Accordingly, an element forming layer 791 is peeled off the substrate 701. It is to be noted herein that the element forming layer 791 includes an element group including the thin film transistors 744 to 748 and the memory element portions 789 and 790, and the conductive film 786 functioning as an antenna. The peeling layer 702 may be partially left without being removed entirely. By leaving a part of the peeling layer 702, consumption of the etchant can be reduced and time for removing the peeling layer can be shortened. In addition, the element forming layer 791 can be retained at the substrate 701 even after the peeling layer 702 is removed.

It is preferable to reuse the substrate 701 after the element forming layer 791 is peeled off in order to reduce the cost. In addition, the insulating film 722 is formed to prevent the element forming layer 791 from scattering after the peeling layer 702 is removed. The element forming layer 791 which is small, thin, and light easily scatters after the peeling layer 702 is removed since it is not attached firmly to the substrate 701. However, by forming the insulating film 772 on the element forming layer 791, the element forming layer 791 is weighted and scattering from the substrate 701 can be prevented. In addition, by forming the insulating film 772, the element forming layer 791 which is in itself thin and light is not rolled by stress or the like after the substrate 701 is peeled off, and the strength thereof at some degree can be ensured.

Figure 10A:
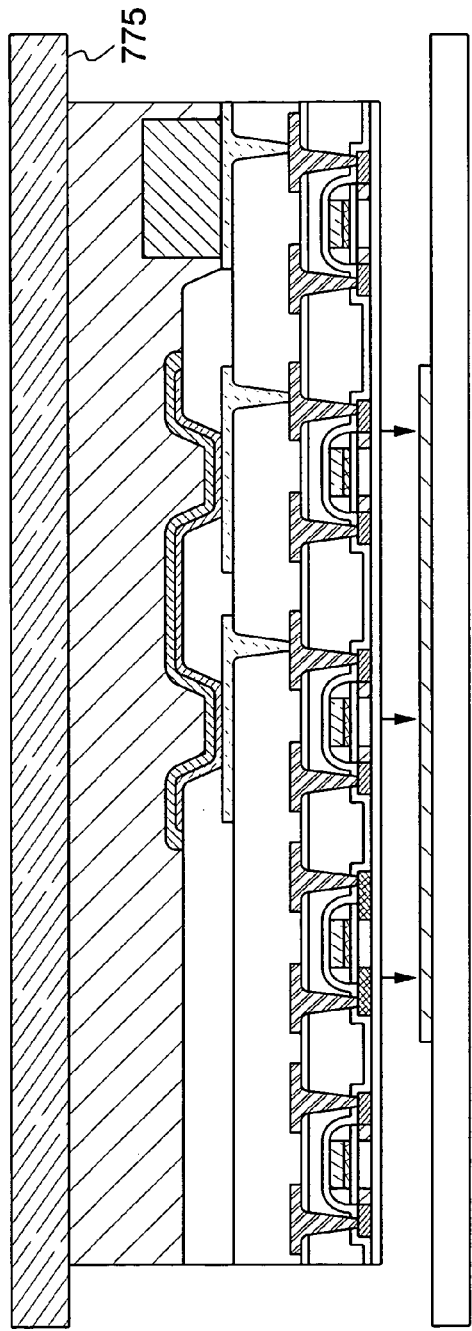
FIGS. 10A and 10B are diagrams showing a manufacturing method of the semiconductor device of the invention.
Figure 10B:
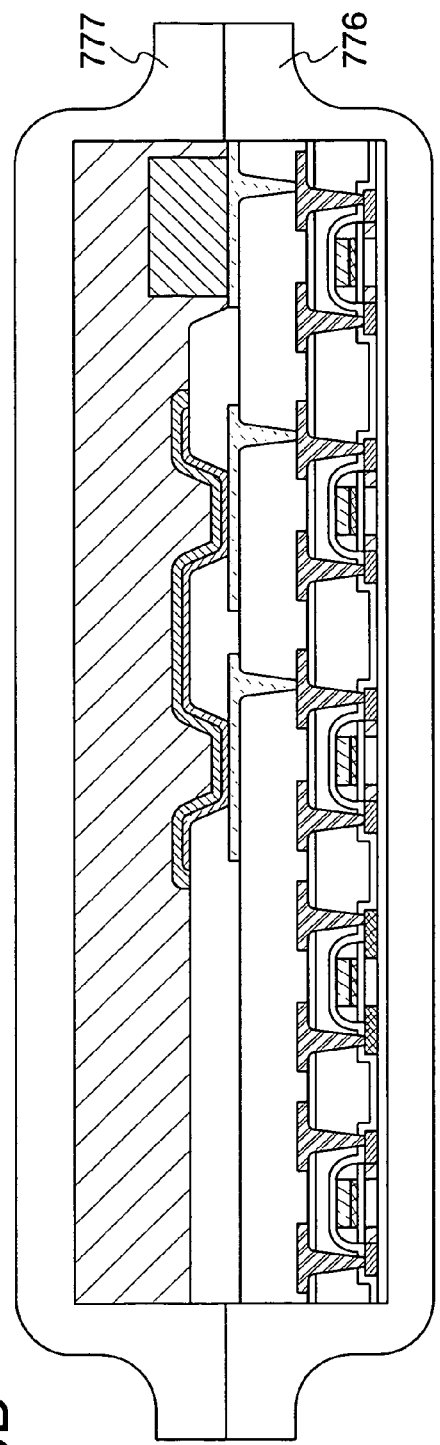

Subsequently, one surface of the element forming layer 791 is attached to a first sheet material 775, and the element forming layer 791 is completely peeled off the substrate 701 (FIG. 10A). When the peeling layer 702 is left partially, the element forming layer is peeled off the substrate 701 by a physical means. Then, a second sheet material 776 is provided on the other surface of the element forming layer 791, and one or both of heat treatment and pressure treatment are performed to attach the second sheet material 776. Simultaneously with or after providing the second sheet material 776, the first sheet member 775 is peeled off and a third sheet material 777 is provided instead. Then, one or both of heat treatment and pressure treatment are performed to attach the third sheet material 777. Accordingly, a semiconductor device which is sealed with the second sheet material 776 and the third sheet material 777 is completed (FIG. 10B).

It is to be noted that the sealing may be performed by the first sheet material 775 and the second sheet material 776; however, in the case where a sheet material used for peeling the element forming layer 791 from the substrate 701 is different from a sheet material used for sealing the element forming layer 791, the element forming layer 791 is sealed with the second sheet material 776 and the third sheet material 777 as described above. This is effective in the case where a sheet material having poor adhesion is required to be used such as the case where the first sheet material 775 may adhere to the substrate 701 not only to the element forming layer 791 when the element forming layer 791 is peeled off the substrate 701.

As the second sheet material 776 and the third sheet material 777 used for sealing, a film formed by using polypropylene, polyester, vinyl, polyvinyl fluoride, polyvinyl chloride, or the like, paper of a fibrous material, a stacked film of a base film (polyester, polyamide, an inorganic vapor deposition film, paper, or the like) and an adhesive synthetic resin film (an acrylic-based synthetic resin, an epoxy-based synthetic resin, or the like), or the like can be used. It is to be noted that heat treatment and pressure treatment are performed by thermocompression bonding to the above-described film in the following manner; an adhesive layer which is provided in the outermost surface of the film or a layer (not an adhesive layer) which is provided in the outermost layer thereof is melted by heart treatment, and then pressure is applied, thereby the film is attached. It is to be noted that an adhesive layer may be provided on a surface of the second sheet material 776 or the third sheet material 777, or may not be provided. The adhesive layer corresponds to a layer containing an adhesive such as a heat curable resin, an ultraviolet-curable resin, an epoxy resin-based adhesive, or a resin additive. In addition, it is preferable to perform silica coating to the sheet material used for sealing in order to prevent moisture and the like from entering inside after the sealing is completed; for example, a sheet material in which an adhesive layer, a film of polyester or the like, and a silica coat are stacked can be used.

Furthermore, as the second sheet material 776 and the third sheet material 777, a film (hereinafter described as an "antistatic film") to which antistatic treatment is performed to prevent static electricity or the like may be used as well. Antistatic films include a film in which an antistatic material is dispersed in a resin, a film to which an antistatic material attached, or the like. The film provided with an antistatic material may be provided with the antistatic material on one surface or both surfaces thereof. Moreover, the film provided with a antistatic material on one surface thereof may be attached to the layer so that the surface on which the antistatic material is provided inside or outside the film. It is to be noted that the antistatic material is provided on an entire surface or a part of the surface of the film. As the antistatic material here, a metal, oxide of indium and tin (ITO), or surfactant such as amphoteric surfactant, cationic surfactant, nonionic surfactant can be used. In addition, a resin material containing cross-linked copolymer macromolecules having a side-chain containing a carboxyl group and a quaternary ammonium base may be alternatively used as the antistatic material. These materials are attached to, kneaded into, or applied to the film, thereby an antistatic film can be formed. By using the antistatic film to seal, adverse effect on the semiconductor element due to outside static electricity or the like can be prevented in the case where it is handled as merchandise.

It is to be noted that this embodiment mode can be implemented combining freely with the above-described embodiment modes. That is, the materials and the forming methods described in the above-described embodiment modes can be used in this embodiment mode while the materials and the forming methods described in this embodiment mode can be used in the above-described embodiment modes.

Embodiment Mode 6

In this embodiment mode, one embodiment mode of a case where a semiconductor device manufactured by the method described in the above-described embodiment modes is used as an RFID which is capable of transmitting and receiving data without contact is described with reference to FIGS. 11A to 11C.

Figure 11A:
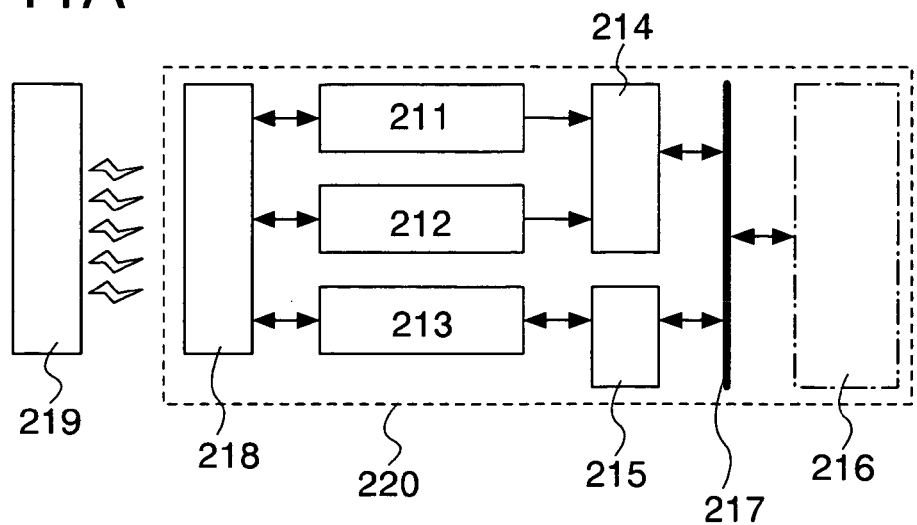
FIGS. 11A to 11C are diagrams each illustrating a usage mode of a semiconductor device of the invention.
Figure 11B:
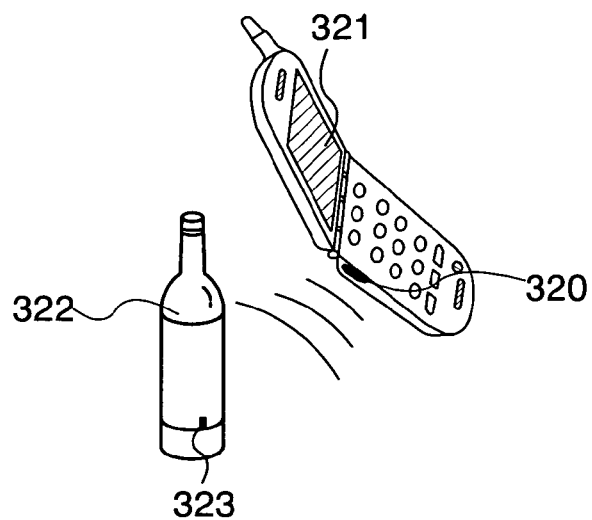
Figure 11C:
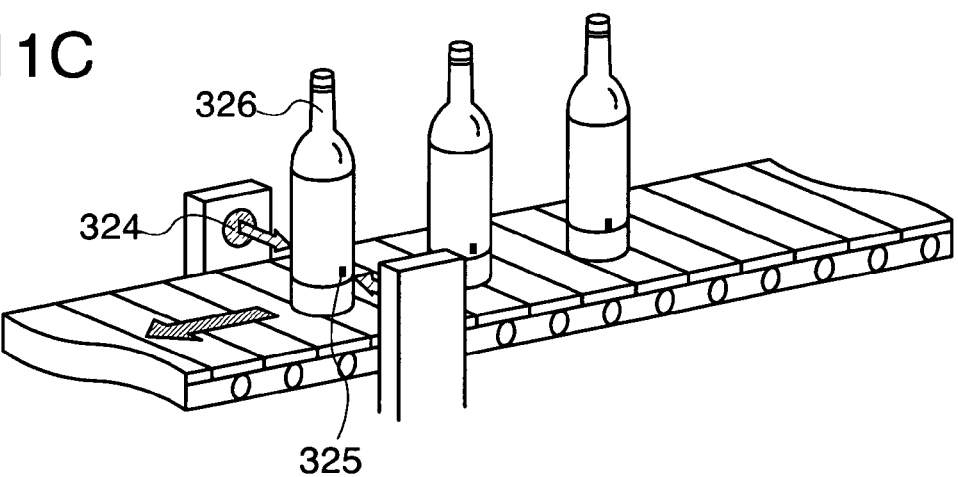

An RFID 220 has a function of communicating data without contact, which includes a power source circuit 211, a clock generating circuit 212, a data demodulation/modulation circuit 213, a control circuit 214 for controlling other circuit, an interface circuit 215, a memory 216, a data bus 217, and an antenna (an antenna coil) 218 (FIG. 11A).

The power source circuit 211 functions to generate power sources supplied for respective circuits in the semiconductor device based on AC signals input from the antenna 218. The clock generating circuit 212 functions to generate clock signals supplied for respective circuits in the semiconductor device based on AC signals input from the antenna 218. The data demodulation/modulation circuit 213 functions to demodulate and modulate data for communicating with a reader/writer 219. The control circuit 214 functions to control the memory 216. The antenna 218 functions to transmit and receive an electromagnetic field and radio waves. The reader/writer 219 controls the semiconductor device, communication with the semiconductor device, and processing of data thereof. Note that the RFID is not limited to this constitution; for example, another component such as a limiter circuit of power source voltage and hardware dedicated to cryptanalysis may be additionally provided.

In addition, the RFID may be a type in which power source voltage is supplied to each circuit by radio waves without mounting a power source (a battery), a type in which power source voltage is supplied to each circuit by a power source (a battery) mounted instead of an antenna, or a type in which power source voltage is supplied by radio waves and a power source.

In the case of applying the semiconductor device of the invention to an RFID or the like, it is advantageous in that: non-contact communication is possible; multiple reading is possible; data writing is possible; transformation into various shapes is possible; directivity is wide and a wide recognition range is provided depending on the selected frequency; and the like. An RFID can be applied to an IC tag which can identify individual information of a person or an object by non-contact radio communication, an adhesive label which can be attached to an object by label processing, a wristband for an event or amusement, or the like. In addition, an RFID may be processed with a resin material and it may be directly fixed to a metal obstructing wireless radio communication. Further, an RFID can be utilized for an operation of a system such as an entrance management system and a checkout system.

One mode of the practical use of the RFID applying the semiconductor device of the invention is described below. A reader/writer 320 is disposed on a side of a portable terminal including a display portion 321, and an RFID 323 is disposed on a side of merchandise 322 (FIG. 11B). When the reader/writer 320 is held up against the RFID 323 of the merchandise 322, information relating to merchandise, such as a raw material and a place of origin of the merchandise, a test result per production process, a record of distribution process, and besides, description of the merchandise is displayed in the display portion 321. In addition, merchandise 326 can be inspected by using a reader/writer 324 and an RFID 325 disposed in the merchandise 326, when the merchandise 326 is transported by a belt conveyor (FIG. 11C). In this manner, information can be easily obtained, and a high function and a high added value are realized by utilizing an RFID for a system.

It is to be noted that this embodiment mode can be implemented combining freely with the above-described embodiment modes.

Embodiment Mode 7

Figure 12:
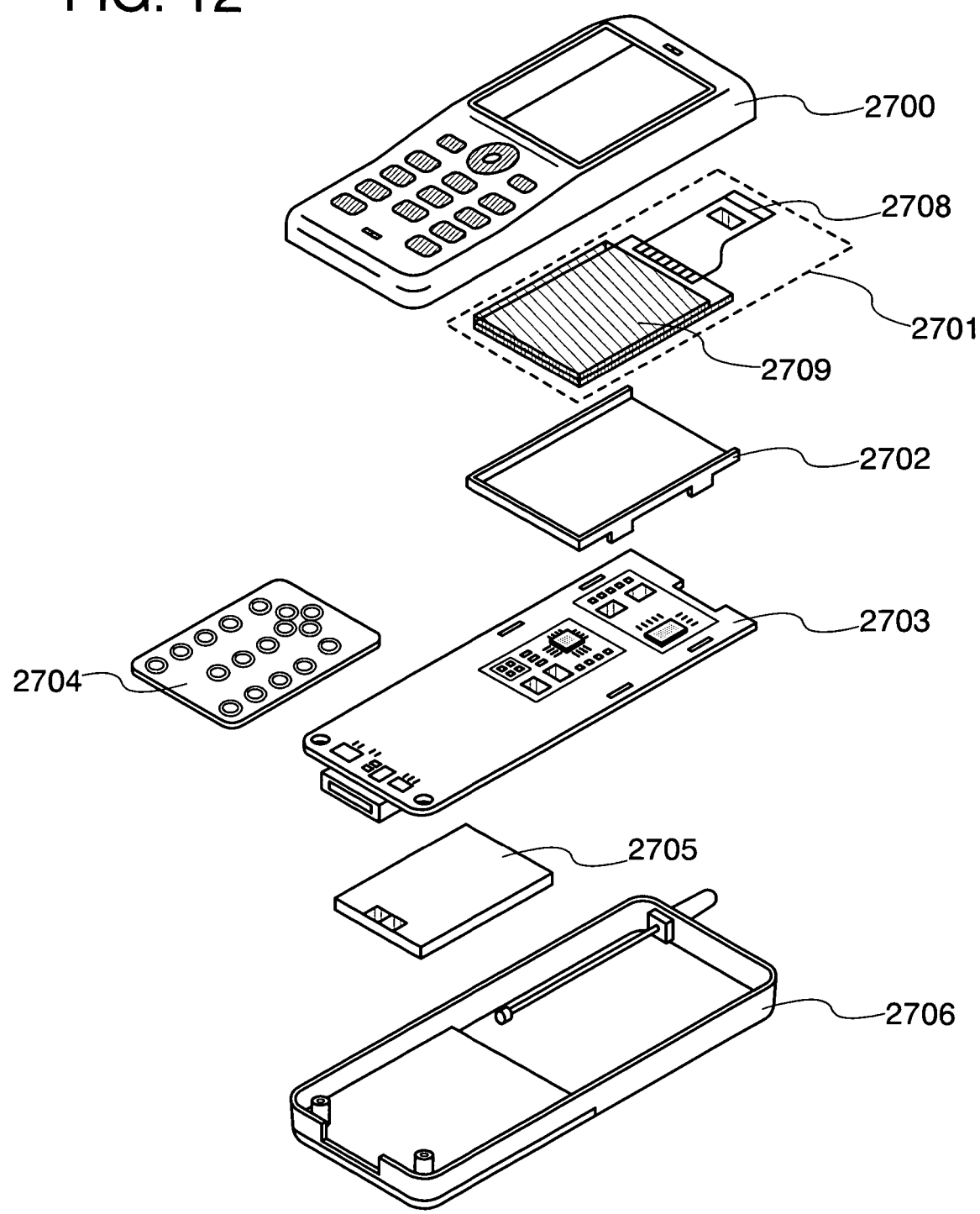
FIG. 12 is a diagram illustrating a usage mode of a semiconductor device of the invention.
Figure 13A:
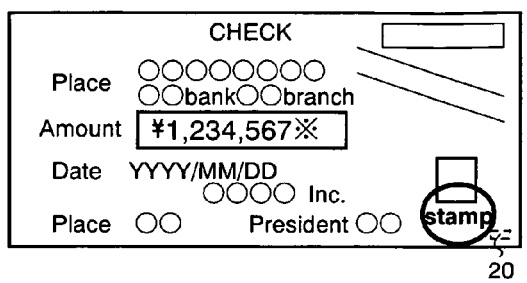
FIGS. 13A to 13H are diagrams each illustrating a usage mode of a semiconductor device of the invention.
Figure 13B:
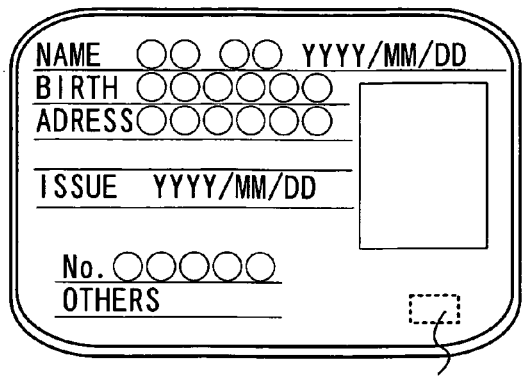
Figure 13C:
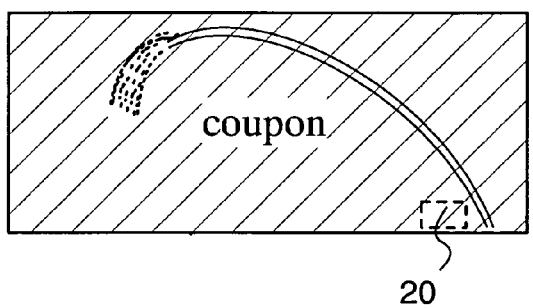
Figure 13D:
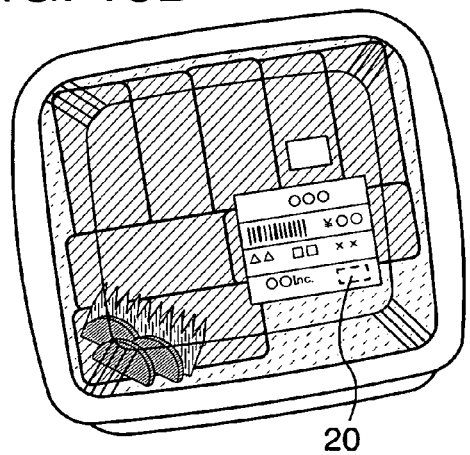
Figure 13E:
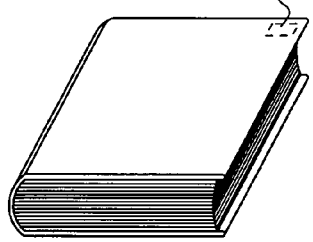
Figure 13F:
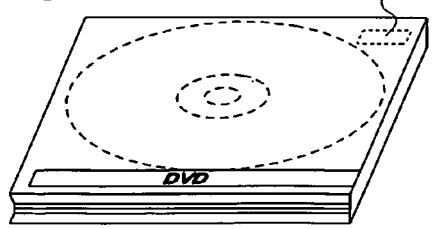
Figure 13G:
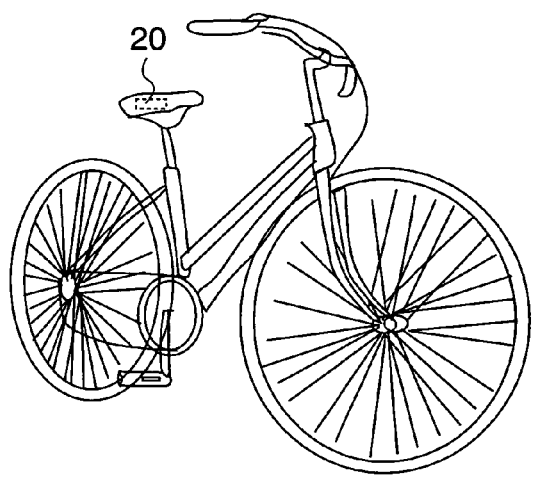
Figure 13H:
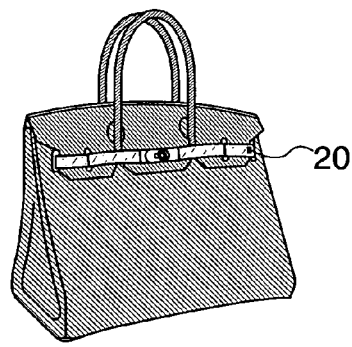

The semiconductor device of the invention can be applied in a wide field. For example, it can be applied to electronic apparatuses. Electronic apparatuses to which the semiconductor device of the invention can be applied include a TV receiver, a computer, a portable information terminal such as a mobile phone, a camera such as a digital camera and a video camera, a navigation system, and the like. The case where the semiconductor device of the invention is applied to a mobile phone is described with reference to FIG. 12.

A mobile phone includes housings 2700 and 2706, a panel 2701, a housing 2702, a printed circuit board 2703, an operating button 2704, and a battery 2705. The housing 2702 incorporating the panel 2701 so as to be detachable is set to the printed circuit board 2703. The form and size of the housing 2702 are appropriately changed in accordance with an electronic apparatus incorporating the panel 2701. A plurality of packaged semiconductor devices is mounted onto the printed circuit board 2703, and the semiconductor device of the invention can be used as one of the semiconductor devices. Each of the plurality of semiconductor devices mounted onto the printed circuit board 2703 has any function of a controller, a central processing unit (CPU), a memory, a power source circuit, an audio processing circuit, a transmitting/receiving circuit, and the like.

The panel 2701 is connected to the printed circuit board 2703 via a connecting film 2708. The panel 2701, the housing 2702, and the printed circuit board 2703 described above are contained inside the housings 2700 and 2706 together with the operating button 2704 and the battery 2705. A pixel region 2709 included in the panel 2701 is disposed so as to be seen from a window provided in the housing 2700.

The semiconductor device of the invention is compact, thin, and light. Accordingly, the semiconductor device can utilize limited space inside the housings 2700 and 2706 of the electronic apparatus effectively.

Moreover, the semiconductor device of the invention can be used as an RFID, for example, in paper money, coins, valuable securities, certificates, bearer bonds, packing containers, books, recording media, personal items, vehicles, food items, clothes, healthcare items, livingwares, medicals, electronic apparatuses, or the like. Examples thereof are described with reference to FIGS. 13A to 13H.

The paper money and the coins mean currency in the market, which include a note (a cash voucher) that is a currency in a specific area, memorial coins and the like. The valuable securities mean a check, a stock certificate, a promissory note, and the like (see FIG. 13A). The certificates mean a driver's license, a resident card and the like (see FIG. 13B). The bearer bonds mean a stamp, a rice coupon, various gift coupons and the like (see FIG. 13C). The packing containers mean a wrapping paper for a lunch box or the like, a plastic bottle and the like (see FIG. 13D). The books mean a book, a volume and the like (see FIG. 13E). The recording media mean DVD software, a video tape and the like (see FIG. 13F). The vehicles mean a wheeled vehicle such as a bicycle, a vessel and the like (see FIG. 13G). The personal items mean a bag, glasses and the like (see FIG. 13H). The food items mean groceries, beverages and the like. The clothes mean wear, footwear and the like. The healthcare items mean a medical instrument, a health appliance and the like. The livingwares mean furniture, a lighting apparatus and the like. The medicals mean a medicine, an agrichemical and the like. The electronic apparatuses mean a liquid crystal display device, an EL display device, a television apparatus (a TV receiver and a thin TV receiver), a mobile phone and the like.

By providing an RFID for paper money, coins, valuable securities, certificates, bearer bonds and the like, counterfeiting thereof can be prevented. Moreover, by providing an RFID for packing containers, books, recording media, personal items, food items, livingwares, electronic apparatuses and the like, the efficiency of the inspection system, the rental system and the like can be improved. By providing an RFID for vehicles, healthcare items, medicals and the like, counterfeiting and theft thereof can be prevented and the medicines can be prevented from being taken by mistake. The RFID may be attached to a surface of an object or embedded in an object. For example, the RFID may be embedded in paper of a book, or embedded in an organic resin of a package.

In this manner, by providing an RFID for packing containers, recording media, personal items, food items, clothes, livingwares, electronic apparatuses and the like, efficiency of the inspection system, the rental system and the like can be improved. By providing an RFID for vehicles, counterfeiting or theft thereof can be prevented. In addition, by embedding an RFID in a creature such as an animal, each creature can be easily identified; for example, by embedding an RFID in a creature such as a domestic animal, the first year of life, sex, breed or the like thereof can be easily identified.

As described hereinabove, the semiconductor device of the invention can be provided for any object to use. It is to be noted that this embodiment mode can be implemented freely combining with the above-described embodiment modes.

EMBODIMENT 1

In this embodiment, configurations of a power source circuit and a delay circuit included in the semiconductor device described in the above-described embodiment modes, and calculation results of operations of the circuits are described with reference to FIGS. 14 to 15C.

Figure 14:
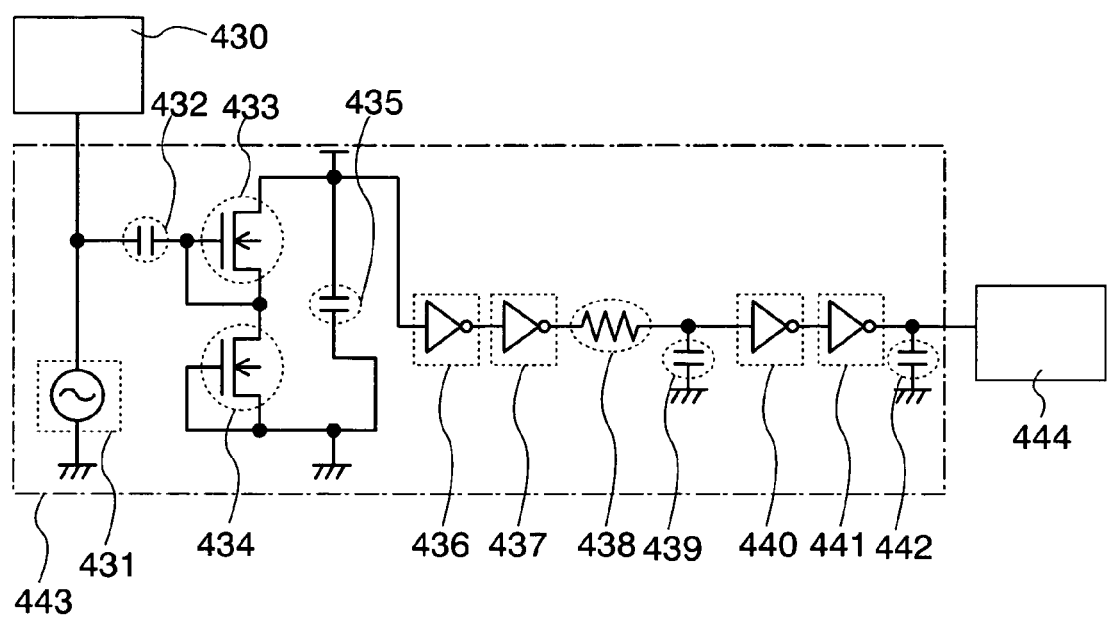
FIG. 14 is a diagram showing constitution of a semiconductor device of the invention.
Figure 15A:
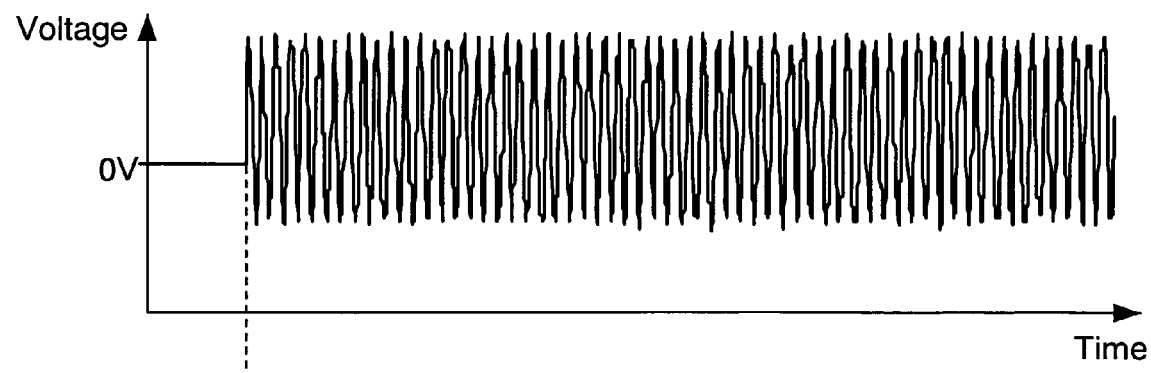
FIGS. 15A to 15C are diagrams showing calculation results.
Figure 15B:
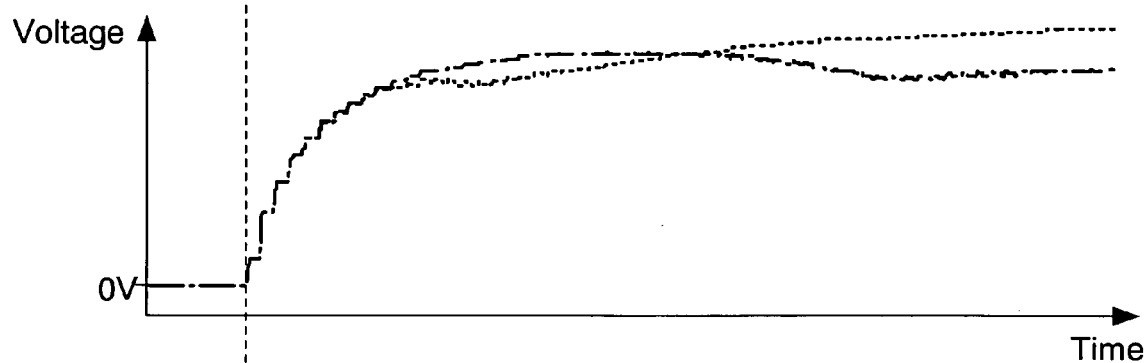
Figure 15C:
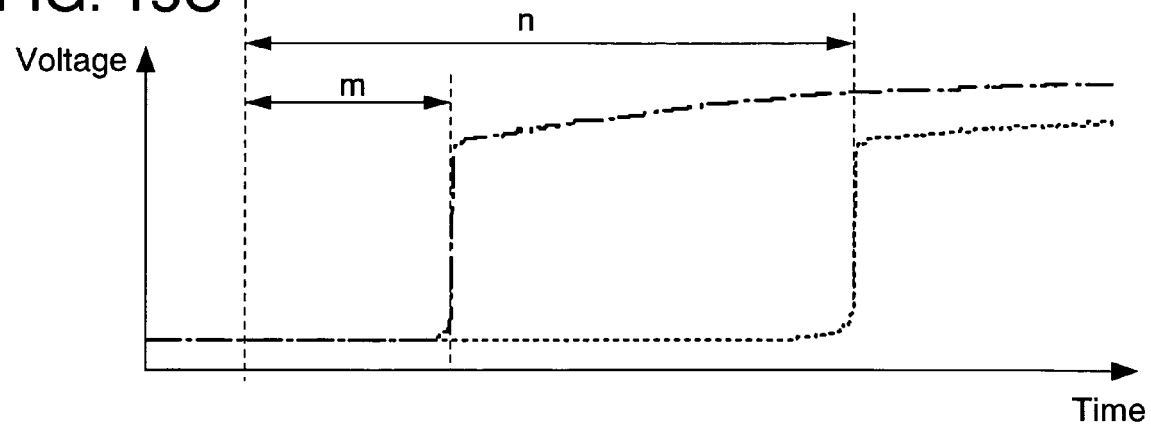

The semiconductor device of the invention includes at least a power source circuit 430 and a delay circuit 443 (FIG. 14).

The power source circuit 430 includes a rectifier circuit for generating a signal (FIG. 15B) by rectifying and smoothing a received carrier wave (FIG. 15A), and a capacitor for holding the signal generated by the rectifier circuit. The signal generated by the rectifier circuit is supplied to the delay circuit 443.

The delay circuit 443 includes an alternating power source 431, a capacitor 432, n-type transistors 433 and 434, a capacitor 435, inverters 436 and 437, a resistor 438, a capacitor 439, inverters 440 and 441, and a capacitor 442. The capacitors 432, 435, 439, and 442 and the resistor 438 are formed by a conductive film, a semiconductor film, a semiconductor film doped with an impurity such as phosphorus and boron, or the like.

The delay circuit 443 generates a reset signal (FIG. 15C) by using the signal (FIG. 15B) input from the power source circuit 430, and besides, supplies the generated reset signal to each circuit. The reset signal generated by the delay circuit 443 is supplied to a circuit 444 during a writing operation or a reading operation. Furthermore, the circuit 444 to which the reset signal is supplied is each circuit included in the semiconductor device, which is a clock signal generating circuit, a correction circuit, a judgment circuit, a controller circuit, an encoding circuit, or the like.

If the reset signal is generated too early by the delay circuit 443, power source supply to each circuit becomes unstable and each circuit may not perform the reset operation. On the other hand, if the reset signal is generated too late by the delay circuit 443, each the circuit may start the next operation without the reset operation. As described above, each circuit may not operate normally when the delay circuit 443 does not generate a reset signal at a desired timing. Therefore, the delay circuit 443 is required to generate a reset signal at a desired timing.

Timing for generating a reset signal by the delay circuit 443 depends on the resistance and the capacitance of the delay circuit 443; specifically, depends on the resistance of the resistor 438 and the capacitance of the capacitor 439. In view of this, according to the invention, a reset signal is generated at a desired timing by optimizing the resistance of the resistor 438 and the capacitance of the capacitor 439.

More specifically, since there was a problem in that the timing for generating a reset signal is too early, the resistance of the resistor 438 is optimized from 100 to 400 kO. Consequently, time required for a carrier wave to be input into the semiconductor device until a reset signal is generated can be delayed to n seconds (n>0, see a waveform shown by a dotted line in FIG. 15C), which was m seconds (m>0, see a waveform shown by a chain line in FIG. 15C) conventionally. In this manner, a reset signal is supplied to each circuit at a desired timing by delaying the timing for generating a reset signal, so that a semiconductor device can be operated normally.

It is to be noted that this embodiment can be implemented freely combining with the above-described embodiment modes.

This application is based on Japanese Patent Application serial no. 2004-351263 filed in Japan Patent Office on 3th Dec., 2004, and the entire contents of which are hereby incorporated by reference.

What is claimed is:

1. A manufacturing method of a semiconductor device comprising:
   forming a metal film over a substrate;
   performing plasma treatment to the metal film to form a metal oxide film over the metal film;
   forming an element forming layer over the metal oxide film;
   forming an insulating film to cover the element forming layer;
   forming an opening in the insulating film and the element forming layer;
   introducing an etchant through the opening to remove the metal film and the metal oxide film; and
   separating the element forming layer from the substrate.

2. The manufacturing method of a semiconductor device according to claim 1, wherein the plasma treatment step is performed in an atmosphere of oxygen.

3. The manufacturing method of a semiconductor device according to claim 1, wherein the metal film comprises an element selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), and iridium (Ir), or an alloy material or a compound material containing the element as a main component.

4. The manufacturing method of a semiconductor device according to claim 1, wherein the element forming layer comprises at least a thin film transistor.

5. The manufacturing method of a semiconductor device according to claim 1, wherein the etchant is a gas or a liquid containing halogen fluoride or an interhalogen compound such as a chlorine trifluoride gas, $CF_4$, $SF_6$, $NF_3$ or $F_2$.

6. The manufacturing method of a semiconductor device according to claim 1, wherein the semiconductor device is incorporated into an electronic apparatus selected from the group consisting of a TV receiver, a computer, a portable information terminal such as a mobile phone, a camera such as a digital camera and a video camera, and a navigation system.

7. A manufacturing method of a semiconductor device comprising:
   forming a metal film over a substrate;
   performing plasma treatment to the metal film to form a metal oxide film over the metal film;
   forming an element forming layer over the metal oxide film;
   forming an insulating film to cover the element forming layer;
   forming an opening in the insulating film and the element forming layer;
   introducing an etchant through the opening to remove the metal film and the metal oxide film so as to leave at least a portion of the metal film and the metal oxide film; and
   separating the element forming layer from the substrate by a physical strength.

8. The manufacturing method of a semiconductor device according to claim 7, wherein the plasma treatment step is performed in an atmosphere of oxygen.

9. The manufacturing method of a semiconductor device according to claim 7, wherein the metal film comprises an element selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), and iridium (Ir), or an alloy material or a compound material containing the element as a main component.

10. The manufacturing method of a semiconductor device according to claim 7, wherein the element forming layer comprises at least a thin film transistor.

11. The manufacturing method of a semiconductor device according to claim 7, wherein the etchant is a gas or a liquid containing halogen fluoride or an interhalogen compound such as a chlorine trifluoride gas, $CF_4$, $SF_6$, $NF_3$ or $F_2$.

12. The manufacturing method of a semiconductor device according to claim 7, wherein the semiconductor device is incorporated into an electronic apparatus selected from the group consisting of a TV receiver, a computer, a portable information terminal such as a mobile phone, a camera such as a digital camera and a video camera, and a navigation system.

13. The manufacturing method of a semiconductor device according to claim 7, wherein the physical strength is a shock (stress) externally using a human hand, pressure of a gas emitted from a nozzle, ultrasonic waves, or a load using a cuneate member.

14. A manufacturing method of a semiconductor device comprising:
    forming a metal film over a substrate;
    performing heat treatment to the metal film to form a metal oxide film over the metal film;
    forming an element forming layer over the metal oxide film;
    forming an insulating film to cover the element forming layer;
    forming an opening in the insulating film and the element forming layer;
    introducing an etchant through the opening to remove the metal film and the metal oxide film; and
    separating the element forming layer from the substrate.

15. The manufacturing method of a semiconductor device according to claim 14, wherein the heat treatment step is performed in an atmosphere of oxygen.

16. The manufacturing method of a semiconductor device according to claim 14, wherein the metal film comprises an element selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), and iridium (Ir), or an alloy material or a compound material containing the element as a main component.

17. The manufacturing method of a semiconductor device according to claim 14, wherein the element forming layer comprises at least a thin film transistor.

18. The manufacturing method of a semiconductor device according to claim 14, wherein the etchant is a gas or a liquid containing halogen fluoride or an interhalogen compound such as a chlorine trifluoride gas, $CF_4$, $SF_6$, $NF_3$ or $F_2$.

19. The manufacturing method of a semiconductor device according to claim 14, wherein the semiconductor device is incorporated into an electronic apparatus selected from the group consisting of a TV receiver, a computer, a portable information terminal such as a mobile phone, a camera such as a digital camera and a video camera, and a navigation system.

20. A manufacturing method of a semiconductor device comprising:
    forming a metal film over a substrate;
    performing heat treatment to the metal film to form a metal oxide film over the metal film;
    forming an element forming layer over the metal oxide film;
    forming an insulating film to cover the element forming layer;
    forming an opening in the insulating film and the element forming layer;
    introducing an etchant through the opening to remove the metal film and the metal oxide film so as to leave at least a portion of the metal film and the metal oxide film; and
    separating the element forming layer from the substrate by a physical strength.

21. The manufacturing method of a semiconductor device according to claim 20, wherein the heat treatment step is performed in an atmosphere of oxygen.

22. The manufacturing method of a semiconductor device according to claim 20, wherein the metal film comprises an element selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), and iridium (Ir), or an alloy material or a compound material containing the element as a main component.

23. The manufacturing method of a semiconductor device according to claim 20, wherein the element forming layer comprises at least a thin film transistor.

24. The manufacturing method of a semiconductor device according to claim 20, wherein the etchant is a gas or a liquid containing halogen fluoride or an interhalogen compound such as a chlorine trifluoride gas, $CF_4$, $SF_6$, $NF_3$ or $F_2$.

25. The manufacturing method of a semiconductor device according to claim 20, wherein the semiconductor device is incorporated into an electronic apparatus selected from the group consisting of a TV receiver, a computer, a portable information terminal such as a mobile phone, a camera such as a digital camera and a video camera, and a navigation system.

26. The manufacturing method of a semiconductor device according to claim 20, wherein the physical strength is a shock (stress) externally using a human hand, pressure of a gas emitted from a nozzle, ultrasonic waves, or a load using a cuneate member.

27. A manufacturing method of a semiconductor device comprising:
    forming a metal oxide film by sputtering over a substrate;
    forming an element forming layer over the metal oxide film;
    forming an insulating film to cover the element forming layer;
    forming an opening in the insulating film and the element forming layer;
    introducing an etchant through the opening to remove the metal oxide film; and
    separating the element forming layer from the substrate.

28. The manufacturing method of a semiconductor device according to claim 27, wherein the metal oxide film is formed in an atmosphere of oxygen.

29. The manufacturing method of a semiconductor device according to claim 27, wherein the element forming layer comprises at least a thin film transistor.

30. The manufacturing method of a semiconductor device according to claim 27, wherein the etchant is a gas or a liquid containing halogen fluoride or an interhalogen compound such as a chlorine trifluoride gas, $CF_4$, $SF_6$, $NF_3$ or $F_2$.

31. The manufacturing method of a semiconductor device according to claim 27, wherein the semiconductor device is incorporated into an electronic apparatus selected from the group consisting of a TV receiver, a computer, a portable information terminal such as a mobile phone, a camera such as a digital camera and a video camera, and a navigation system.

32. A manufacturing method of a semiconductor device comprising:
   forming a metal oxide film by sputtering over a substrate;
   forming an element forming layer over the metal oxide film;
   forming an insulating film to cover the element forming layer;
   forming an opening in the insulating film and the element forming layer;
   introducing an etchant through the opening to remove the metal oxide film so as to leave at least a portion of the metal oxide film; and
   separating the element forming layer from the substrate by a physical strength.

33. The manufacturing method of a semiconductor device according to claim 32, wherein the metal oxide film is formed in an atmosphere of oxygen.

34. The manufacturing method of a semiconductor device according to claim 32, wherein the element forming layer comprises at least a thin film transistor.

35. The manufacturing method of a semiconductor device according to claim 32, wherein the etchant is a gas or a liquid containing halogen fluoride or an interhalogen compound such as a chlorine trifluoride gas, $CF_4$, $SF_6$, $NF_3$ or $F_2$.

36. The manufacturing method of a semiconductor device according to claim 32, wherein the semiconductor device is incorporated into an electronic apparatus selected from the group consisting of a TV receiver, a computer, a portable information terminal such as a mobile phone, a camera such as a digital camera and a video camera, and a navigation system.

37. The manufacturing method of a semiconductor device according to claim 32, wherein the physical strength is a shock (stress) externally using a human hand, pressure of a gas emitted from a nozzle, ultrasonic waves, or a load using a cuneate member.

38. A manufacturing method of a semiconductor device comprising:
   forming a metal film over a substrate;
   forming a metal oxide film over the metal film;
   forming an insulating film over the metal oxide film;
   forming a thin film transistor having a crystalline semiconductor film over the insulating film;
   forming an antenna over the thin film transistor;
   forming an opening to expose the metal oxide film;
   introducing an etchant through the opening to remove the metal film and the metal oxide film; and
   separating the thin film transistor from the substrate.

39. The manufacturing method of a semiconductor device according to claim 38, wherein the metal oxide film is formed by performing plasma treatment to the metal film in an atmosphere of oxygen.

40. The manufacturing method of a semiconductor device according to claim 38, wherein the metal oxide film is formed by performing heat treatment to the metal film in an atmosphere of oxygen.

41. The manufacturing method of a semiconductor device according to claim 38, wherein the metal oxide film is formed by performing sputtering in an atmosphere of oxygen.

42. The manufacturing method of a semiconductor device according to claim 38, wherein the crystalline semiconductor film is formed by crystallizing a semiconductor film by irradiating laser light.

43. The manufacturing method of a semiconductor device according to claim 38, wherein the etchant is a gas or a liquid containing halogen fluoride or an interhalogen compound such as a chlorine trifluoride gas, $CF_4$, $SF_6$, $NF_3$ or $F_2$.

44. The manufacturing method of a semiconductor device according to claim 38, wherein the semiconductor device is incorporated into an electronic apparatus selected from the group consisting of a TV receiver, a computer, a portable information terminal such as a mobile phone, a camera such as a digital camera and a video camera, and a navigation system.

45. A manufacturing method of a semiconductor device comprising:
   forming a metal film over a substrate;
   forming a metal oxide film over the metal film;
   forming an insulating film over the metal oxide film;
   forming a thin film transistor having a crystalline semiconductor film over the insulating film;
   forming an antenna over the thin film transistor;
   forming an opening to expose the metal oxide film;
   introducing an etchant through the opening to remove the metal film and the metal oxide film so as to leave at least a portion of the metal film and the metal oxide film; and
   separating the thin film transistor from the substrate by a physical strength.

46. The manufacturing method of a semiconductor device according to claim 45, wherein the metal oxide film is formed by performing plasma treatment to the metal film in an atmosphere of oxygen.

47. The manufacturing method of a semiconductor device according to claim 45, wherein the metal oxide film is formed by performing heat treatment to the metal film in an atmosphere of oxygen.

48. The manufacturing method of a semiconductor device according to claim 45, wherein the metal oxide film is formed by performing sputtering in an atmosphere of oxygen.

49. The manufacturing method of a semiconductor device according to claim 45, wherein the crystalline semiconductor film is formed by crystallizing a semiconductor film by irradiating laser light.

50. The manufacturing method of a semiconductor device according to claim 45, wherein the etchant is a gas or a liquid containing halogen fluoride or an interhalogen compound such as a chlorine trifluoride gas, $CF_4$, $SF_6$, $NF_3$ or $F_2$.

51. The manufacturing method of a semiconductor device according to claim 45, wherein the semiconductor device is incorporated into an electronic apparatus selected from the group consisting of a TV receiver, a computer, a portable information terminal such as a mobile phone, a camera such as a digital camera and a video camera, and a navigation system.

52. The manufacturing method of a semiconductor device according to claim 45, wherein the physical strength is a shock (stress) externally using a human hand, pressure of a gas emitted from a nozzle, ultrasonic waves, or a load using a cuneate member.

* * * * *